United States Patent
Sole Rojals et al.

(10) Patent No.: US 9,379,736 B2
(45) Date of Patent: Jun. 28, 2016

(54) CONTEXT-ADAPTIVE CODING VIDEO DATA

(75) Inventors: Joel Sole Rojals, La Jolla, CA (US);
Rajan Laxman Joshi, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 722 days.

(21) Appl. No.: 13/485,225

(22) Filed: May 31, 2012

(65) Prior Publication Data

US 2012/0328026 A1   Dec. 27, 2012

Related U.S. Application Data

(60) Provisional application No. 61/493,371, filed on Jun. 3, 2011, provisional application No. 61/503,537, filed on Jun. 30, 2011, provisional application No. 61/552,921, filed on Oct. 28, 2011, provisional application No. 61/554,408, filed on Nov. 1, 2011, provisional application No. 61/561,921, filed on Nov. 20, 2011.

(51) Int. Cl.
*H04N 7/12* (2006.01)
*H03M 7/00* (2006.01)
(Continued)

(52) U.S. Cl.
CPC .......... *H03M 7/6023* (2013.01); *H03M 7/4018* (2013.01); *H03M 7/6011* (2013.01); *H04N 19/13* (2014.11); *H04N 19/196* (2014.11); *H04N 19/436* (2014.11); *H04N 19/463* (2014.11)

(58) Field of Classification Search
CPC . H04N 19/00072; H04N 19/13; H04N 19/18; H04N 19/91
USPC ...................................... 375/240.26
See application file for complete search history.

(56) References Cited

U.S. PATENT DOCUMENTS

| 7,088,271 | B2 | 8/2006 | Marpe et al. |
| 7,365,659 | B1 | 4/2008 | Hoffmann et al. |

(Continued)

FOREIGN PATENT DOCUMENTS

| EP | 2312854 A1 | 4/2011 |
| WO | 2009105726 A1 | 8/2009 |

(Continued)

OTHER PUBLICATIONS

Japanese Office Action from corresponding Japanese Application Serial No. 2014-513751 dated Jan. 27, 2015 7 pp.

(Continued)

*Primary Examiner* — Dave Czekaj
*Assistant Examiner* — Tsion B Owens
(74) *Attorney, Agent, or Firm* — Shumaker & Sieffert, P.A.

(57) ABSTRACT

In an example, aspects of this disclosure relate to a method of coding data that includes coding a sequence of bins according to a context adaptive entropy coding process. A current coding cycle used to code at least one bin of the sequence of bins includes determining a context for the bin; selecting a probability model based on the context, wherein the probability model is updated based on a value of a previous bin coded with the context and coded at least two coding cycles prior to the current coding cycle; applying the probability model to code the bin; and updating the probability model based on a value of the bin.

58 Claims, 12 Drawing Sheets

(51) Int. Cl.

| | | |
|---|---|---|
| H03M 7/30 | (2006.01) | |
| H03M 7/40 | (2006.01) | |
| H04N 19/196 | (2014.01) | |
| H04N 19/13 | (2014.01) | |
| H04N 19/463 | (2014.01) | |
| H04N 19/436 | (2014.01) | |

(56) References Cited

U.S. PATENT DOCUMENTS

| | | | |
|---|---|---|---|
| 7,894,523 B2 | 2/2011 | Jeon et al. | |
| 8,482,440 B2* | 7/2013 | Lee | H04N 19/436 341/106 |
| 9,001,882 B2* | 4/2015 | Sachdeva | H04N 19/91 375/240 |
| 9,264,706 B2* | 2/2016 | Karczewicz | H03M 7/30 |
| 2005/0169374 A1* | 8/2005 | Marpe | H04N 19/176 375/240.16 |
| 2006/0233240 A1 | 10/2006 | Cha et al. | |
| 2007/0177664 A1 | 8/2007 | Lee | |
| 2008/0080620 A1 | 4/2008 | Lee et al. | |
| 2008/0219578 A1 | 9/2008 | Lee | |
| 2008/0313484 A1 | 12/2008 | Ratakonda et al. | |
| 2009/0267825 A1 | 10/2009 | Vetro et al. | |
| 2010/0054615 A1 | 3/2010 | Choi et al. | |
| 2010/0232722 A1 | 9/2010 | Park et al. | |
| 2011/0210874 A1 | 9/2011 | Korodi et al. | |
| 2011/0310958 A1* | 12/2011 | Sachdeva | H04N 19/42 375/240.02 |
| 2012/0026020 A1* | 2/2012 | Korodi | H03M 7/4056 341/51 |
| 2012/0140813 A1 | 6/2012 | Sole Rojals et al. | |
| 2012/0177300 A1 | 7/2012 | Sasai et al. | |
| 2012/0207213 A1* | 8/2012 | Amon | H04N 19/13 375/240.08 |
| 2012/0230418 A1 | 9/2012 | Sole Rojals et al. | |
| 2012/0230419 A1 | 9/2012 | Sole Rojals et al. | |
| 2012/0230420 A1 | 9/2012 | Sole Rojals et al. | |
| 2012/0328003 A1* | 12/2012 | Chien | H04N 19/176 375/240.03 |
| 2013/0027230 A1* | 1/2013 | Marpe | H03M 7/4006 341/107 |

FOREIGN PATENT DOCUMENTS

| | | |
|---|---|---|
| WO | 2009119888 A1 | 10/2009 |
| WO | WO2010063184 A1 | 6/2010 |
| WO | 2011045339 A1 | 4/2011 |
| WO | WO2011042645 A1 | 4/2011 |
| WO | 2012096178 A1 | 7/2012 |

OTHER PUBLICATIONS

ITU-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.
ITU-T H.265, Series H: Audiovisual and Multimedia Systems, Infrastructure of audiovisual services—Coding of moving video, Advanced video coding for generic audiovisual services, The International Telecommunication Union. Oct. 2014, 540 pp.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
Response to Written Opinion dated Jul. 13, 2012, from International Application No. PCT/US2012/040491, filed Apr. 3, 2013, 35 pp.
Second Written Opinion from International Application No. PCT/US2012/040491, dated May 22, 2013, 5 pp.
Response to Second Written Opinion dated May 22, 2013, from International Application No. PCTUS2012/040491, filed Jul. 22, 2013, 31 pp.

International Preliminary Report on Patentability from International Application No. PCT/2012/040491, dated Aug. 27, 2012, 9 pp.
Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, CH, Nov. 21-30, 2011, 259 pp.
Bross, et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27-May 7, 2012, JCTVC-I1003_d21, 290 pp.
Bross, et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, 261 pp.
Bross et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pp.
Bross et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pp.
Chung-Hyo Kim et al: "High Speed Decoding of Context-based Adaptive Binary Arithmetic Codes Using Most Probable Symbol Prediction", 2006 IEEE International Symposium on Circuits and Systems May 21-24, 2006 Island of Kos, Greece, IEEE—Piscataway, NJ, USA, May 21, 2006, pp. 1707-1710, XP010938711. 4 pp.
Hisao Sasai et al: "Parallel Context Processing for Significance map using block-based context updates", 20110310, No. JCTVC-E226, Mar. 10, 2011 (Mar. 18, 2011), XP030008732. 4 pp.
International Search Report and Written Opinion—PCT/US2012/040491—ISA/EPO—Jul. 13, 2012. 17 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Joshi R. et al: "CE1: Delayed state update for CABAC", 7. JCT-VC Meeting; 98. MPEG Meeting; Nov. 21, 2011-Nov. 30, 2011; Geneva; (Joint Collaborative Team on Video Coding of ISO/IEC JTC1/SC29/WG11 and ITU-T 56.16) ; URL: http://wftp3.itu.int/av-arch/jctvc-site/, No. JCTVC-G576, Nov. 9, 2011, XP030110560. 5 pp.
Marpe, D. et al., "Context-based adaptive binary arithmetic coding in the H.264/AVC video compression standard", IEEE Transactions on Circuits and Systems for Video Technology, Jul. 1, 2003, pp. 620-636, vol. 13, No. 7, IEEE Service Center, XP011099255, ISSN: 1051-8215, DOI: 10.1109/TCSVT.2003.815173.
Wahl, S. et al: "Memory-Efficient Parallelization of JPEG-LS with Relaxed Context Update", Picture Coding Symposium 2010; Aug. 12, 2010-Oct. 12, 2010; Nagoya,, Dec. 8, 2010, XP030081949. 4 pp.
Sze, V. et al.,"Massively Parallel CABAC", 38. VCEG Meeting, 89. MPEG Meeting, Jan. 7, 2009-Aug. 7, 2009, London, Geneva, (Video Coding Experts Group of ITU-T SG. 16), , No. VCEG-AL21, Jul. 3, 2009, XP030003702. 10 pp.
Wiegand, Thomas et al.,"WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010. 137 pp.
Wiegand et al., "WD3: Working Draft 3 of High-Efficiency Video Coding," Document JCTVC-E603, 5th Meeting: Geneva, CH, Mar. 16-23, 2011, 193 pp.
Wiegand T. et al., "WD2: Working Draft 2 of High-Efficiency Video Coding", 20110128, No. JCTVC-D503, Jan. 28, 2011, XP002679642, Retrieved from the Internet: URL: http://wftp3.itu.int/av-arch/jctvc-site/2011_01_D_Daegu/ [retrieved on Jul. 11, 2012]. 153 pp.
Sze V., et al., "A high throughput CABAC algorithm using syntax element partitioning", Proceedings of the 16th IEEE international conference on Image Processing (ICIP), Nov. 7, 2009, pp. 773-776, IEEE, Piscataway, NJ, USA, XP031628909, ISBN: 978-1-4244-5653-6.
Notice of Grounds for Rejection from corresponding Korean Application Serial No. 2014-7000083 dated Jul. 9, 2015 including translation (20 pages).

(56) References Cited

OTHER PUBLICATIONS

Auyeung et al: "Parallel processing friendly simplified context selection of significance map", JCT-VC Meeting; MPEG Meeting; Jan. 20-28, 2011; Daegu; (Joint Collaborative Team on Video Coding of ISO/IEC JTC1/SC29/WG11 and ITU-T SG.16); No. JCTVC-D260, XP030008300, 6 pp., Jan. 16, 2011.

Sasai., et al., "CE1: Subset A: Parallel context processing for coefficient coding using block-based context updates" Joint Collaborative Team on Video Coding (JCT-VC) of ITU-T SG16 WP3 and ISO/IEC JTC1/SC29/WG11, 7th Meeting: Geneva, CH, Nov. 21-30, 2011, JCTVC-G349r1, 6 pp., Nov. 2011.

Sole, et al., "CE11: Parallel Context Processing for the significance map in high coding efficiency", JCT-VC Meeting; MPEG Meeting; Mar. 16-23, 2011; Geneva; (Joint Collaborative Team on Video Coding of ISO/IEC JTC1/SC29/WG11 AND ITU-T SG.16); No. JCTVC-E338, XP030008844, 4 pp., Mar. 11, 2011.

Sole, et al., "Parallel Context Processing For the Significance Map in High Coding Efficiency", JCT-VC Meeting; MPEG Meeting; Jan. 20-28, 2011; Daegu; (Joint Collaborative Team on Video Coding of ISO/IEC JTC1/SC29/WG11 and ITU-T SG. 16); URL: http://wftp3.itu.int/av-arch/jctvc-site/, No. JCTVC-D262, XP030008302, 4 pp., Jan. 16, 2011.

Sole, et al.," Parallel processing of residual data in HE", JCT-VC Meeting; MPEG Meeting; Jul. 14-22, 2011; Torino; (Joint Collaborative Team on Video Coding of ISO/IEC JTCI/SC29/WGII and ITU-T SG. 16) ; URL: http://wftp3.itu.int/av-arch/jctvc-site/, No. JCTVC-F552, XP03000957, 6 pp., Jul. 16, 2011.

Final Office Action and English Translation from counterpart Japanese Patent Application No. 2014-513751, mailed dated Dec. 8, 2015, 8 pp.

* cited by examiner

CONTEXT-ADAPTIVE CODING VIDEO DATA

This application claims priority to U.S. Provisional Patent Application No. 61/493,371, filed 3 Jun. 2011, U.S. Provisional Patent Application No. 61/503,537, filed 30 Jun. 2011, U.S. Provisional Patent Application No. 61/552,921, filed 28 Oct. 2011, U.S. Provisional Patent Application No. 61/554,408, filed 1 Nov. 2011, and U.S. Provisional Patent Application No. 61/561,921, filed 20 Nov. 2011, the entire contents of all of which are hereby incorporated by reference in their entirety.

TECHNICAL FIELD

This disclosure relates to video coding, and more particularly, to coding blocks of residual transform coefficients generated by video coding processes.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

The techniques of this disclosure generally relate to entropy coding video data. For example, during entropy coding, a video coder may convert transform coefficients into binary form, thereby generating one or more bits, or "bins." The video coder may then code each bin for a block of video data using probability estimates for each bin, which may indicate a likelihood of a bin having a given binary value. The probability estimates may be included within a probability model, also referred to as a "context model." A video coder may select a context model by determining a context for the bin. Context for a bin of a syntax element may include values of related bins of previously coded syntax elements. After coding the bin, the video coder may update the context model based on a value of the bin to reflect the most current probability estimates.

Certain techniques of this disclosure generally relate to probability updating during entropy coding. That is, in some examples, a video coder may update probability models after coding each bin. In such examples, probabilities may be relatively accurate, however, there may be latencies associated with the updating process. In other examples, the video coder may store statistics associated with bin values and update probability models after coding a full block of video data. Such techniques may reduce latencies, however, performance may also decline due to less accurate probabilities during coding of the block. Aspects of this disclosure relate to increasing the granularity of the probability updating process so that probability models may be updated more frequently than after a full block of video data, but without updating the probability models after each bin. For example, aspects of this disclosure relate to updating probabilities after coding a predetermined sub-set of transform coefficients associated with a block of video data. In this way, the techniques of this disclosure may strike a balance between coding performance and coding speed, and may allow for parallel processing of bins of a sub-set.

Certain aspects of this disclosure also relate to other techniques for parallelized entropy coding. For example, the techniques of this disclosure also include coding a bin of data using a probability model that is updated prior to coding one or more previous bins. That is, the probability model may be updated at least two coding iterations, or cycles, prior to coding the current bin. Accordingly, the techniques of this disclosure may avoid delays that result from updating a probability model after coding a bin using the model, when multiple consecutive bins are coded using the same model. In some examples, such techniques may be applied to code bins of a block of video data in parallel.

In an example, aspects of this disclosure relate to a method of coding data that includes coding a sequence of bins according to a context adaptive entropy coding process. A current coding cycle used to code at least one bin of the sequence of bins includes determining a context for the bin; selecting a probability model based on the context, wherein the probability model is updated based on a value of a previous bin coded with the context and coded at least two coding cycles prior to the current coding cycle, applying the probability model to code the bin, and updating the probability model based on a value of the bin.

In another example, aspects of this disclosure relate to an apparatus for coding data that includes one or more processors configured to code a sequence of bins according to a context adaptive entropy coding process. A current coding cycle used to code at least one bin of the sequence of bins includes determining a context for the bin, selecting a probability model based on the context, wherein the probability model is updated based on a value of a previous bin coded with the context and coded at least two coding cycles prior to the current coding cycle, applying the probability model to code the bin, and updating the probability model based on a value of the bin.

In another example, aspects of this disclosure relate to an apparatus for coding data that includes means for coding a sequence of bins according to a context adaptive entropy coding process. A current coding cycle used to code at least one bin of the sequence of bins includes determining a context for the bin, selecting a probability model based on the context, wherein the probability model is updated based on a value of a previous bin coded with the context and coded at least two coding cycles prior to the current coding cycle, applying the probability model to code the bin, and updating the probability model based on a value of the bin.

In another example, aspects of this disclosure relate to a computer-readable storage medium having instructions stored thereon that, when executed, cause one or more processors to code a sequence of bins according to a context adaptive entropy coding process. A current coding cycle used to code at least one bin of the sequence of bins includes determining a context for the bin, selecting a probability model based on the context, wherein the probability model is updated based on a value of a previous bin coded with the context and coded at least two coding cycles prior to the current coding cycle, applying the probability model to code the bin, and updating the probability model based on a value of the bin.

In another example, aspects of this disclosure relate to a method of coding transform coefficients associated with residual video data in a video coding process that includes coding a first sub-set of a plurality of subsets of transform coefficients, wherein coding the first sub-set comprises context-adaptive coding the first sub-set using one or more probability models, storing, while coding the first sub-set of transform coefficients, probability model statistics associated with the one or more probability models, updating, after coding a final coefficient of the first sub-set, the probability models based on the stored probability model statistics, and coding a second sub-set of the transform coefficients using the updated one or more probability models.

In another example, aspects of this disclosure relate to an apparatus for coding transform coefficients associated with residual video data that includes one or more processors configured to code a first sub-set of a plurality of subsets of transform coefficients, wherein coding the first sub-set comprises context-adaptive coding the first sub-set using one or more probability models, store, while coding the first sub-set of transform coefficients, probability model statistics associated with the one or more probability models, update, after coding a final coefficient of the first sub-set, the probability models based on the stored probability model statistics, and code a second sub-set of the transform coefficients using the updated one or more probability models.

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

Figure 1:
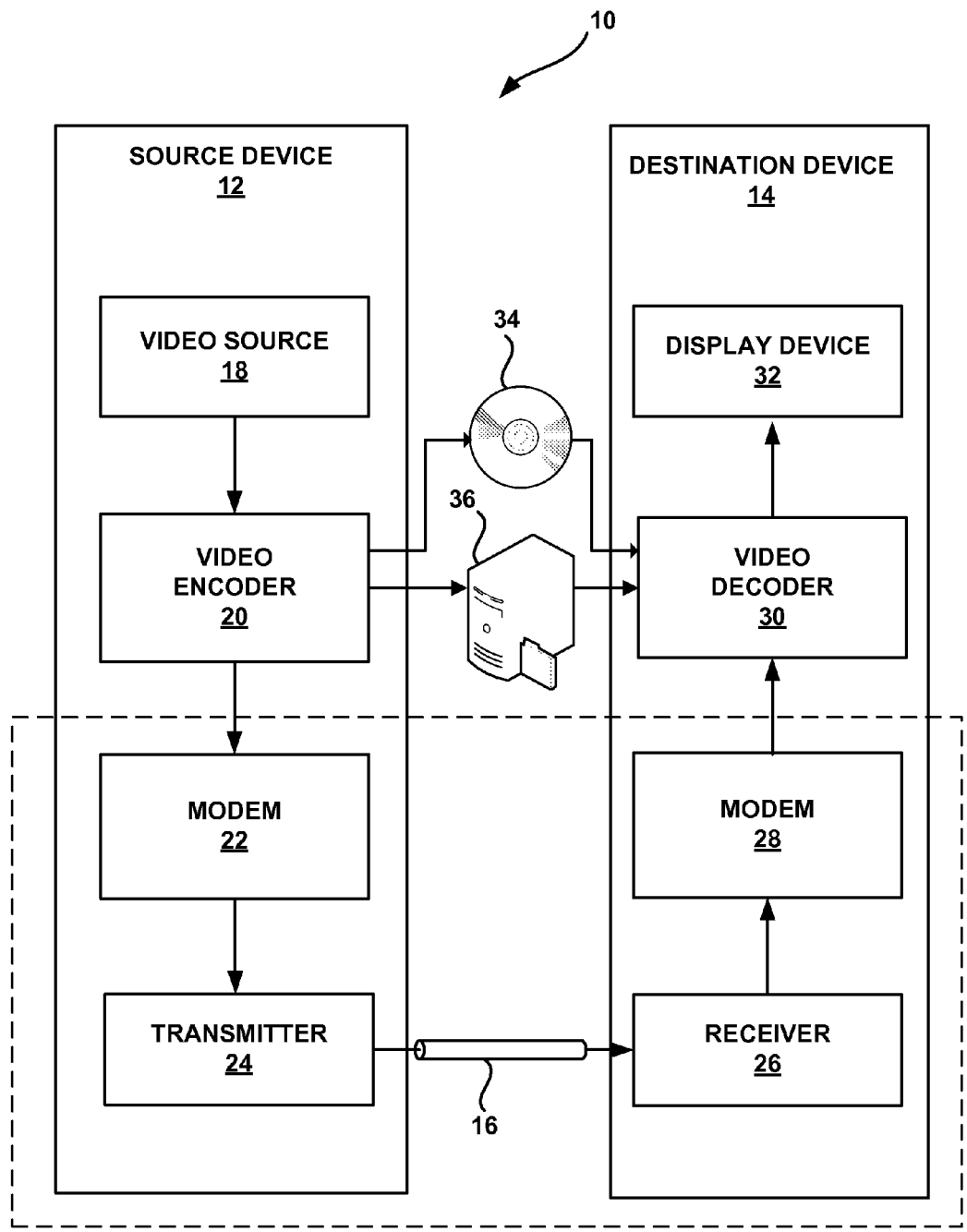
FIG. 1 is a block diagram illustrating an example video encoding and decoding system that may utilize the techniques of this disclosure.

A video coding device may attempt to compress video data by taking advantage of spatial and temporal redundancy. For example, a video encoder may take advantage of spatial redundancy by coding a block relative to neighboring, previously coded blocks. Likewise, a video encoder may take advantage of temporal redundancy by coding a block relative to data of previously coded frames. In particular, the video encoder may predict a current block from data of a spatial neighbor or from data of a previously coded frame. The video encoder may then calculate a residual for the block as a difference between the actual pixel values for the block and the predicted pixel values for the block. Accordingly, the residual for a block may include pixel-by-pixel difference values in the pixel (or spatial) domain.

The video encoder may then apply a transform to the values of the residual to compress energy of the pixel values into a relatively small number of transform coefficients in the frequency domain. The video encoder may then quantize the transform coefficients. The video encoder may scan the quantized transform coefficients to convert a two-dimensional matrix of quantized transform coefficients into a one-dimensional vector including the quantized transform coefficients.

The process of scanning the coefficients is sometimes referred to as serializing the coefficients.

The video encoder may then apply an entropy coding process to entropy encode the scanned coefficients. Example entropy coding processes may include, for example, context-adaptive variable length coding (CAVLC), context-adaptive binary arithmetic coding (CABAC), syntax-based context-adaptive binary arithmetic coding (SBAC), probability interval partitioning entropy (PIPE) coding or other entropy encoding methodologies. The video encoder may also entropy encode syntax elements associated with the encoded video data for use by a video decoder in decoding the video data.

A video decoder may perform generally reciprocal techniques to the encoding techniques performed by the video encoder. Although generally reciprocal, the video decoder may, in some instances, perform techniques similar to those performed by the video encoder. The video decoder may also rely on syntax elements or other data contained in a received bitstream that includes the data described with respect to the video encoder.

With respect to (CABAC) as an example, a video coder (video encoder and/or video decoder) may select a probability model or "context model" that operates on context to code symbols associated with a block of video data. For example, at the encoder, a target symbol may be coded by using the probability model. At the decoder, a target symbol may be parsed by using the probability model. Context may relate to, for example, whether values are zero or non-zero for symbols neighboring a symbol currently being coded.

According to some examples, the positions of the significant coefficients (i.e., nonzero transform coefficients) in a video block may be encoded prior to the values of the transform coefficients, which may be referred to as the "levels" of the transform coefficients. The process of coding the locations of the significant coefficients may be referred to as significance map coding. A significance map (SM) includes a two-dimensional array of binary values that indicate locations of significant coefficients.

For example, an SM for a block of video data may include a two-dimensional array of ones and zeros, in which the ones indicate positions of significant transform coefficients within the block and the zeros indicate positions of non-significant (zero-valued) transform coefficients within the block. The ones and zeros are referred to as "significant coefficient flags." Additionally, in some examples, the SM may include another 2-D array of ones and zeros, in which a one indicates a position of a last significant coefficient within the block according to a scanning order associated with the block, and the zeros indicate positions of all other coefficients within the block. In this case, the ones and zeros are referred to as "last significant coefficient flags." In other examples, such last significant coefficient flags are not used. Rather, the last significant coefficient in a block may be coded first, before sending the rest of the SM. In any case, SM coding for a block of video data may consume a significant percentage of the video bitrate used to code the block.

After the SM is coded, a video coder may entropy code the level of each transform coefficient. For example, a video coder may convert an absolute value of each non-zero transform coefficient into binary form. In this way, each non-zero transform coefficient may be "binarized," e.g., using a unary code comprising one or more bits, or "bins." In addition, a number of other binarized syntax elements may be included to allow a video decoder to decode the video data.

A video coder may code each bin for a block of video data, whether corresponding to transform coefficients or syntax information for the block, using probability estimates for each bin. The probability estimates may indicate a likelihood of a bin having a given binary value (e.g., "0" or "1"). The probability estimates may be included within a probability model, also referred to as a "context model." A video coder may select a probability model by determining a context for the bin. Context for a bin of a syntax element may include values of related bins of previously coded neighboring syntax elements.

As one example, the context for each significant coefficient flag of the block includes a type of the block (e.g., block size), and a position of a coefficient corresponding to the respective flag within the block according to a scanning order associated with the block. As another example, the context for each bin of a binarized residual transform coefficient absolute value for the block includes a position of the bin within a unary codeword that represents the absolute value, and values of previously coded coefficients of the block. In other examples, the context for a bin of a syntax element (e.g., coded block pattern, or "CBP") includes values of related bins of previously coded neighboring syntax elements, e.g., on the top and to the left of the current syntax element. In any case, a different probability model is defined for each context. After coding the bin, the probability model is further updated based on a value of the bin to reflect the most current probability estimates.

The bins associated with a block of video data may be coded in one or more coding "passes." For example, during a first pass, a video coder may entropy code the SM. During a second pass, the video coder may entropy code a first bin of the transform coefficient levels. The video coder may continue to perform coding passes until all of the information associated with the transform coefficients of a block is coded. In some examples, the video coder may code the bins of a block of video data using a combination of context adaptive and non-context adaptive coding. For example, for one or more passes, the video coder may use a bypass mode to bypass, or omit, the regular arithmetic coding process. In such instances, a fixed equal probability model may be used to code a bypass coded bin. Bypass coded bins doe not include context or probability updates.

When performing context adaptive coding, in some examples, there may be relatively high serial dependencies due to multiple feedback loops. For example, context, which indicates a particular probability model for coding a bin, may be influenced by values of previously coded bins, e.g., related bins of previously coded syntax elements. In addition, the probability model used to code the bin may also be influenced by values of previously coded bins. That is, the probability model may be maintained as a state in a finite state machine. Each particular state may correspond to a specific probability value. The next state, which corresponds to an update of the probability model, may depend on the value of the current bin (e.g., the bin currently being coded).

Accordingly, the probability estimates within the probability model may be influenced by the values of the previously coded bins, because the values indicate, at least in part, the probability of the bin having a given value. As a result, context adaptive coding (e.g., CABAC) is performed in a serial manner, e.g., on a bin by bin basis. For example, after coding a current bin for which a particular context is determined, a probability model that corresponds to the context must be updated before coding a next bin for which the same context is determined, and thus corresponds to the same probability model.

As one example, a sequence of bins (e.g., bin(0), bin(1), . . . bin(n)) of a block of video data may be coded in succession using a same probability model (e.g., probability model A). In other words, the contexts derived for the bins (e.g., indicated using context indices ctx(0), ctx(1), . . . ctx(n)) may each correspond to the same probability model used to code the respective bins. In this example, after coding a given one of the bins, the probability model must be updated based on a value of the bin before the probability model can be used to code any subsequent bins. Updating the probability model allows the model to reflect the most current probabilities of a bin coded using the model having a given value. As such, coding a particular bin for a block of video data using a probability model updated following completion of a previous coding cycle, i.e., coding of a previous bin, for the block as described above, may create a delay between the successive coding cycles. Specifically, the probability model may not be readily available to code the particular bin immediately after coding the previous bin. As a result, the coding of the sequence of bins may not be as streamlined as coding the sequence using other methods. In these cases, coding efficiency may suffer.

In addition, as noted above, a particular probability model may be maintained as a state in a finite state machine, with each particular state corresponding to a specific probability value. The next state, which corresponds to an update of the probability model, may depend on the value of the current bin. Such feedback loops, which may be referred to as state updates, may present a computational bottleneck. For example, it may be difficult to increase throughput due to the dependencies in the feedback loops. That is, one bin may not be processed until the probability model from the previous bin has been updated. In some examples, the same context index may be called continuously (bin by bin) with high frequency. In an example, the context for significance flag coding, which may represent from 25% to 35% of the total bins encoded by the coder, may be called continuously. Repeatedly calling the same context and waiting to update the model after each bin may present a bottleneck for the throughput of the whole coder.

To avoid the context update bottleneck described above, in some examples, a video coder may store certain statistics and update one or more contexts after coding an entire block of video data. For example, rather than updating context for coding each bin, the video coder may store probability statistics for the probabilities associated with each context to memory for the block of video data. Accordingly, the probability for coding each bin of a block is not changed, and there is no dependency on an updated probability within the block loop. Following coding of a block, the stored probabilities (e.g., the state of context) that were updated during coding of the block is set to the current probabilities for the next block. In this way, instead of updating the context probability after each bin, the probability models for the contexts that were used in coding of bins for the current block are updated once at the end of the current block. The overall coding performance, however, may decline, because the probabilities are not updated bin by bin and may therefore be less accurate.

Aspects of this disclosure relate to increasing the granularity of the probability updating process so that probability models may be updated more frequently than after a full block of video data, but without updating the probability models after each bin. For example, aspects of this disclosure relate to updating probabilities after coding a predetermined sub-set of transform coefficients associated with a block of video data. In this way, the techniques of this disclosure may strike a balance between coding performance and coding speed, and may allow for parallel processing of bins of a sub-set.

In an example, a video coder may divide transform coefficients associated with a block of video data into a plurality of sub-sets. After determining sub-sets, the video coder may perform context adaptive coding (e.g., such as CABAC, PIPE, or another coding method) for each sub-set. That is, for example, the video coder may perform coding passes for coding the significance map, the coefficient level, and the coefficient sign for the transform coefficients of a first sub-set. The video coder may then move on to the next sub-set and repeat the coding process. The video coder may continue to code each sub-set of the block until the entire block has been coded.

According to aspects of this disclosure, updating probabilities associated with contexts may be linked to the coding of each sub-set. For example, the video coder may collect and store statistics associated with the probability models that are applied while coding a sub-set of transform coefficients. After coding the sub-set, the video coder may update the probability models for each context used during the coding of the sub-set using the stored probability statistics. The video coder may use the updated probabilities for coding the next sub-set of transform coefficients. In this way, the video coder may code transform coefficients of each sub-set without updating the probabilities during the coding of the sub-sets.

A video coder may determine a sub-set in a variety of ways. In one example, a sub-set may include a predetermined number of bins in scanning order (e.g., the order in which transform coefficients of a block of video data are serialized). In an example for purposes of illustration, for an 8×8 block of transform coefficients (e.g., 64 total coefficients), a first sub-set may include the first 16 coefficients in scanning order, a second sub-set may include the second 16 coefficients in scanning order, a third sub-set may include the third 16 coefficients in scanning order, and a fourth sub-set may include the final 16 coefficients of the block in scanning order. The video coder may determine sub-sets in this manner regardless of the scanning direction/order (e.g., horizontal, vertical, diagonal, zig-zag, adaptive, and the like). In this example, according to aspects of this disclosure, the video coder may update probabilities after coding all bins of each sub-set in scanning order.

In another example, the video coder may determine sub-sets by dividing a block of transform coefficients into a plurality of sub-blocks. In an example for purposes of illustration, the video coder may divide an 8×8 block of transform coefficients (e.g., 64 total coefficients) into four 4×4 sub-blocks. The video coder may scan each of the sub-blocks using a particular scanning order (e.g., horizontal, vertical, diagonal, zig-zag, adaptive, and the like). The scanning order may be the same or different for each of the sub-blocks. In this example, the video coder may update probabilities after coding all bins of each sub-block.

Rather than waiting to update the probabilities until after all of the bins of a particular sub-set have been coded, according to aspects of this disclosure, in another example, the video coder may update probabilities after each coding pass of each sub-set. In this example, the video coder may parallelize the updating process of the probability models of one pass within the sub-set with other passes of the sub-set. For example, the video coder may update the probabilities for the bins of the significance information for a sub-set of transform coefficients, while coding bin 1 of coefficient levels during another coding pass of the sub-set. In this example, the contexts of one pass may not be used for coding the other passes within the sub-set.

In other examples, the video coder may update the probabilities after coding a predetermined number of bins of a sub-set. For example, the video coder may code a significance map prior to coding transform coefficient levels. In such an example, the video coder may code the significance map and update the probabilities after coding the significance map. The video coder may then code the remaining information associated with the transform coefficients (e.g., sign, levels, and the like). In examples in which the video coder codes both a last_x and a last_y syntax elements, the video coder may update the probabilities after coding both the last_x and the last_y of the last significant coefficient, or the video encoder may update the probabilities after coding each of the last_x and the last_y.

The techniques of this disclosure may be applied to increase the ability to process bins in parallel (e.g., relative to updating context after every bin) while also maintaining coding performance (e.g., relative to only updating context after every full block of transform coefficients. For example, the techniques of this disclosure may enhance coding parallelization, as more than one bin of a sub-set may be coded in parallel. The techniques of this disclosure may also promote coding efficiency, as probabilities updated after each sub-set may be more accurate for coding certain transform coefficients of a block than probabilities that are updated at the end of a block.

Certain aspects of this disclosure also relate to techniques for parallelized entropy coding. For example, the techniques of this disclosure include coding a bin of data using a probability model that is updated prior to coding a previous bin. That is, the probability model may be updated at least two coding iterations, or cycles, prior to coding the current bin. Accordingly, the techniques of this disclosure may avoid delays that result from updating a probability model after coding a bin using the model, when multiple consecutive bins are coded using the same model. In some examples, such techniques may be applied to code bins of a block of video data in parallel. For example, the techniques of this disclosure may avoid performance degradation associated with updating probability models less frequently, such as after coding a full block of transform coefficients, while still maintaining a probability update for relatively accurate probabilities.

In an example for purposes of illustration, assume that a sequence of bins, e.g., bin(0), bin(1), . . . , bin(n-1), and bin(n), of a block of video data is coded in succession by performing a context adaptive entropy coding process, e.g., a CABAC process. In this example, a probability model corresponding to a context determined for any one of the bins is included in a context buffer, or "ctxBuffer." Let the probability model corresponding to a context determined for bin(n) be included in ctxBuffer(n). The probability model may be defined by an initial state, and, as previously described, may be influenced by previously coded bins, i.e. bin(0), bin(1), . . . , bin(n-1).

According to aspects of this disclosure, a video coder may use a probability model included in ctxBuffer(n-K) to code bin(n). The index "K" may equal any positive non-zero integer value. For example, for "K" values of "1," the context buffer ctxBuffer(n-1) includes a probability model that is updated two coding cycles prior to the current coding cycle. In particular, the probability model included in ctxBuffer(n-1) is the probability model included in ctxBuffer(n-2) that is updated following coding bin(n-2). Updating probability models in this way may be referred to as delayed state updating, as one or more cycles of delay are introduced between probability updates.

In the example described above, while the probability model included in ctxBuffer(n-1) is not readily available to code bin(n-1) because of updating, the model is available to code bin(n) one coding cycle later (e.g., the updating has been completed by the time bin(n) is coded). As such, it is not necessary for a coder to wait until the probability model included in ctxBuffer(n-1) is further updated based on bin (n-1), coded during a previous coding cycle, to code bin(n). Accordingly, the aspects of this disclosure may avoid delays associated with probability updating and may allow more than one bin to be coded in parallel.

In some examples, an initial probability model to code the first and second bins of the sequence. For example, bin(0) and bin(1) of a given sequence may both be coded using ctxBuffer (0). Bin(0) may be coded in this manner because no previously updated probability models exist. Bin(1) may be coded in this manner to avoid the probability updating delays described above, which may result from updating the probability model included in ctxBuffer(0) based on the value of bin(0).

Additionally, in examples in which context partitioning is used, the techniques of this disclosure can be applied for each context partition. For example, in syntax partitioning, bins are grouped based on syntax element and placed in different partitions which are then processed in parallel (e.g., as described in V. Sze and A. P. Chandrakasan, "A high throughput CABAC algorithm using syntax element partitioning," IEEE International Conference on Image Processing, pp. 773-776, 2009). In such a case, the concept of delaying the state update is applied to each partition. For example, if one partition contains all the contexts used for residual transform coefficient coding and another partition contains the remaining contexts, the delayed context update may in this example be applied to each partition separately.

The aspects of this disclosure regarding delayed state updating, as described above, may be applied to one or more types of bins. For example, the delayed state update techniques may be applied only for contexts used to code transform coefficient levels. In another example, the delayed state update techniques may be used only for significance map coding.

Accordingly, the techniques of this disclosure may avoid delays that result from updating a probability model after coding a bin using the model, when multiple consecutive bins are coded using the model. In addition, the techniques of this disclosure may avoid performance degradation associated with updating probability models less frequently, such as after coding a full block of transform coefficients. In some examples, the techniques described in this disclosure may be used independently or may be used together in any combination.

While described above with respect to binary video coding, it should be understood that the delayed state update techniques may be generally applied to other arithmetic coding of other data.

For example, in instances in which more than two symbols are included in a probability model, it may not be feasible to perform a simple state update. Accordingly, rather than performing a delayed state update, aspects of this disclosure include performing a delayed probability update.

As an example, for purposes of illustration, assume that a sequence of symbols, e.g., symbol(0), symbol(1), . . . , symbol (n), etc. are being encoded or decoded. The symbols may be generated by video data, audio data, or any other data. Furthermore, assume that each symbol may take four values denoted by A, B, C, and D. In addition, assume that a different context model may be associated with each symbol, but for purposes of illustration, all the symbols use the same context. In addition, assume that a separate probability model (e.g., probabilities for A, B, C, and D) is maintained for each context. Normally, after symbol(0) is coded, the probability model for context(0) would be updated to account for the actual value of symbol(0). However, according to aspects of this disclosure, the probability model updating process may be delayed until one or more future symbols are being coded. For example, for a delay of one, the updated model (e.g., after coding symbol(0)) is available for coding symbol(2).

Accordingly, while certain examples may be described with respect to binary coding, and more specifically CABAC coding of video data, the techniques of this disclosure are more generally applicable to arithmetic coding. That is, the delayed state and/or probability update techniques described above may be generally applied to m-ary arithmetic coding schemes, which may or may not be context adaptive.

FIG. 1 is a block diagram illustrating an example video encoding and decoding system 10 that may be configured to utilize the techniques described in this disclosure for context adaptive coding. As shown in the example of FIG. 1, system 10 includes a source device 12 that generates encoded video for decoding by destination device 14. Source device 12 may transmit the encoded video to destination device 14 via communication channel 16 or may store the encoded video on a storage medium 34 or a file server 36, such that the encoded video may be accessed by the destination device 14 as desired. Source device 12 and destination device 14 may comprise any of a wide variety of devices, including desktop computers, notebook (i.e., laptop) computers, tablet computers, set-top boxes, telephone handsets such as so-called smartphones, televisions, cameras, display devices, digital media players, video gaming consoles, or the like.

In many cases, such devices may be equipped for wireless communication. Hence, communication channel 16 may comprise a wireless channel, a wired channel, or a combination of wireless and wired channels suitable for transmission of encoded video data. For example, communication channel 16 may comprise any wireless or wired communication medium, such as a radio frequency (RF) spectrum or one or more physical transmission lines, or any combination of wireless and wired media. Communication channel 16 may form part of a packet-based network, such as a local area network, a wide-area network, or a global network such as the Internet. Communication channel 16 generally represents any suitable communication medium, or collection of different communication media, for transmitting video data from source device 12 to destination device 14, including any suitable combination of wired or wireless media. Communication channel 16 may include routers, switches, base stations, or any other equipment that may be useful to facilitate communication from source device 12 to destination device 14.

The techniques described in this disclosure may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

As further shown in the example of FIG. 1, source device 12 includes a video source 18, video encoder 20, a modulator/demodulator (modem) 22 and a transmitter 24. In source device 12, video source 18 may include a source such as a video capture device. The video capture device, by way of example, may include one or more of a video camera, a video archive containing previously captured video, a video feed interface to receive video from a video content provider, and/or a computer graphics system for generating computer graphics data as the source video. As one example, if video source 18 is a video camera, source device 12 and destination device 14 may form so-called camera phones or video phones. The techniques of this disclosure, however, are not necessarily limited to wireless applications or settings, and may be applied to non-wireless devices including video encoding and/or decoding capabilities. Source device 12 and destination device 16 are merely examples of coding devices that can support the techniques described herein.

The captured, pre-captured, or computer-generated video may be encoded by video encoder 20. The encoded video information may be modulated by modem 22 according to a communication standard, such as a wireless communication protocol, and transmitted to destination device 14 via transmitter 24. Modem 22 may include various mixers, filters, amplifiers or other components designed for signal modulation. Transmitter 24 may include circuits designed for transmitting data, including amplifiers, filters, and one or more antennas.

The captured, pre-captured, or computer-generated video that is encoded by the video encoder 20 may also be stored onto a storage medium 34 or a file server 36 for later consumption. The storage medium 34 may include Blu-ray discs, DVDs, CD-ROMs, flash memory, or any other suitable digital storage media for storing encoded video. The encoded video stored on the storage medium 34 may then be accessed by destination device 14 for decoding and playback.

File server 36 may be any type of server capable of storing encoded video and transmitting that encoded video to the destination device 14. Example file servers include a web server (e.g., for a website), an FTP server, network attached storage (NAS) devices, a local disk drive, or any other type of device capable of storing encoded video data and transmitting it to a destination device. The file server 36 may be accessed by the destination device 14 through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server. The transmission of encoded video data from the file server 36 may be a streaming transmission, a download transmission, or a combination of both.

This disclosure may generally refer to video encoder 20 "signaling" certain information to another device, such as video decoder 30. It should be understood, however, that video encoder 20 may signal information by associating certain syntax elements with various encoded portions of video data. That is, video encoder 20 may "signal" data by storing certain syntax elements to headers of various encoded portions of video data. In some cases, such syntax elements may be encoded and stored (e.g., stored to storage medium 34 or file server 36) prior to being received and decoded by video decoder 30. Thus, the term "signaling" may generally refer to the communication of syntax or other data for decoding compressed video data, whether such communication occurs in real- or near-real-time or over a span of time, such as might occur when storing syntax elements to a medium at the time of encoding, which then may be retrieved by a decoding device at any time after being stored to this medium.

Destination device 14, in the example of FIG. 1, includes a receiver 26, a modem 28, a video decoder 30, and a display device 32. Receiver 26 of destination device 14 receives information over channel 16, and modem 28 demodulates the information to produce a demodulated bitstream for video decoder 30. The information communicated over channel 16 may include a variety of syntax information generated by video encoder 20 for use by video decoder 30 in decoding video data. Such syntax may also be included with the encoded video data stored on a storage medium 34 or a file server 36. Each of video encoder 20 and video decoder 30 may form part of a respective encoder-decoder (CODEC) that is capable of encoding or decoding video data.

Display device 32 may be integrated with, or external to, destination device 14. In some examples, destination device 14 may include an integrated display device and also be configured to interface with an external display device. In other examples, destination device 14 may be a display device. In general, display device 32 displays the decoded video data to a user, and may comprise any of a variety of display devices such as a liquid crystal display (LCD), a plasma display, an organic light emitting diode (OLED) display, or another type of display device.

Video encoder 20 and video decoder 30 may operate according to a video compression standard, such as the High Efficiency Video Coding (HEVC) standard currently under development, and may conform to the HEVC Test Model (HM). Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples include MPEG-2 and ITU-T H.263.

The HEVC standard refers to a block of video data as a coding unit (CU). In general, a CU has a similar purpose to a macroblock coded according to H.264, except that a CU does not have a size distinction. Thus, a CU may be split into sub-CUs. In general, references in this disclosure to a CU may refer to a largest coding unit (LCU) of a picture or a sub-CU of an LCU. For example, syntax data within a bitstream may define the LCU, which is a largest coding unit in terms of the number of pixels. An LCU may be split into sub-CUs, and each sub-CU may be split into sub-CUs. Syntax data for a bitstream may define a maximum number of times an LCU may be split, referred to as a maximum CU depth. Accordingly, a bitstream may also define a smallest coding unit (SCU).

An LCU may be associated with a hierarchical quadtree data structure. In general, a quadtree data structure includes one node per CU, where a root node corresponds to the LCU. If a CU is split into four sub-CUs, the node corresponding to the CU includes four leaf nodes, each of which corresponds to one of the sub-CUs. Each node of the quadtree data structure may provide syntax data for the corresponding CU. For example, a node in the quadtree may include a split flag, indicating whether the CU corresponding to the node is split into sub-CUs. Syntax elements for a CU may be defined recursively, and may depend on whether the CU is split into sub-CUs.

A CU that is not split may include one or more prediction units (PUs). In general, a PU represents all or a portion of the corresponding CU, and includes data for retrieving a reference sample for the PU. For example, when the PU is intra-mode encoded, the PU may include data describing an intra-prediction mode for the PU. As another example, when the PU is inter-mode encoded, the PU may include data defining a motion vector for the PU. The data defining the motion vector may describe, for example, a horizontal component of the motion vector, a vertical component of the motion vector, a resolution for the motion vector (e.g., one-quarter pixel precision or one-eighth pixel precision), a reference frame to which the motion vector points, and/or a reference list (e.g., list 0 or list 1) for the motion vector. Data for the CU defining the PU(s) may also describe, for example, partitioning of the CU into one or more PUs. Partitioning modes may differ between whether the CU is uncoded, intra-prediction mode encoded, or inter-prediction mode encoded.

A CU having one or more PUs may also include one or more transform units (TUs). Following prediction using a PU, a video encoder may calculate a residual value for the portion of the CU corresponding to the PU. The residual value may be transformed, quantized, and scanned. A TU is not necessarily limited to the size of a PU. Thus, TUs may be larger or smaller than corresponding PUs for the same CU. In some examples, the maximum size of a TU may be the size of the corresponding CU. This disclosure also uses the term "block" to refer to any of a CU, PU, or TU.

As described above, in general, encoded video data may include prediction data and residual data. Video encoder 20 may produce the prediction data during an intra-prediction mode or an inter-prediction mode. Intra-prediction generally involves predicting the pixel values in a block of a picture relative to reference samples in neighboring, previously coded blocks of the same picture. Inter-prediction generally involves predicting the pixel values in a block of a picture relative to data of a previously coded picture.

Following intra- or inter-prediction, video encoder 20 may calculate residual pixel values for the block. The residual values generally correspond to differences between the predicted pixel value data for the block and the true pixel value data of the block. For example, the residual values may include pixel difference values indicating differences between coded pixels and predictive pixels. In some examples, the coded pixels may be associated with a block of pixels to be coded, and the predictive pixels may be associated with one or more blocks of pixels used to predict the coded block.

To further compress the residual values of a block, the residual values may be transformed into a set of transform coefficients that compact as much data (also referred to as "energy") as possible into as few coefficients as possible. Transform techniques may comprise a discrete cosine transform (DCT) process or conceptually similar process, integer transforms, wavelet transforms, or other types of transforms. The transform converts the residual values of the pixels from the spatial domain to a transform domain. The transform coefficients correspond to a two-dimensional matrix of coefficients that is ordinarily the same size as the original block. In other words, there are just as many transform coefficients as pixels in the original block of residual data. However, due to the transform, many of the transform coefficients may have values equal to zero.

Video encoder 20 may then quantize the transform coefficients to further compress the video data. Quantization generally involves mapping values within a relatively large range to values in a relatively small range, thus reducing the amount of data needed to represent the quantized transform coefficients. More specifically, quantization may be applied according to a quantization parameter (QP), which may be indexed to a quantizer step size that is applied to a transform coefficient during quantization.

Following quantization, video encoder 20 may scan the transform coefficients, producing a one-dimensional vector from the two-dimensional matrix including the quantized transform coefficients. Video encoder 20 may then entropy encode the resulting array to even further compress the data. In general, entropy coding comprises one or more processes that collectively compress a sequence of quantized transform coefficients and/or other syntax information. For example, syntax elements, such as the delta QPs, prediction vectors, coding modes, filters, offsets, or other information, may also be included in the entropy coded bitstream. The scanned coefficients are then entropy coded along with any syntax information, e.g., via CAVLC, CABAC, PIPE, or another entropy coding process.

To perform CAVLC, video encoder 20 may select a variable length code for a symbol to be transmitted. Codewords in VLC may be constructed such that relatively shorter codes correspond to more likely symbols, while longer codes correspond to less likely symbols. In this way, the use of VLC may achieve bit rate savings over, for example, using equal-length codewords for each symbol to be transmitted.

To perform CABAC, video encoder 20 may select a context model to apply to a certain context to encode symbols to be transmitted. The context may relate to, for example, whether neighboring values are non-zero or not. Video encoder 20 may also entropy encode syntax elements, such as a significant coefficient flag and a last coefficient flag produced when performing an adaptive scan.

In general, the video decoding process performed by video decoder 30 may include reciprocal techniques to the encoding techniques performed by video encoder 20. Although generally reciprocal, video decoder 30 may, in some instances, perform techniques similar to those performed by video encoder 20. Video decoder 30 may also rely on syntax elements or other data contained in a received bitstream that includes the data described with respect to video encoder 20.

According to aspects of this disclosure, video encoder 20 and/or video decoder 30 may update probability models used during entropy coding after coding a predetermined sub-set of transform coefficients associated with a block of video data. For example, video encoder 20 and/or video decoder 30 may divide transform coefficients associated with a block of video data into a plurality of sub-sets. Video encoder 20 and/or video decoder 30 may continue to code each sub-set of the block until the entire block has been coded. According to aspects of this disclosure, video encoder 20 and/or video decoder 30 may update probabilities associated with contexts after coding of each sub-set. For example, video encoder 20 and/or video decoder 30 may collect and store statistics associated with the probability models that are applied while coding a sub-set of transform coefficients. After coding the sub-set, video encoder 20 and/or video decoder 30 may update the probability models for each context used during the coding of the sub-set using the stored probability statistics. Video encoder 20 and/or video decoder 30 may use the updated probabilities for coding the next sub-set of transform coefficients. In this way, video encoder 20 and/or video decoder 30 may code transform coefficients of each sub-set without updating the probabilities during the coding of the sub-sets. In this way, the techniques of this disclosure may strike a balance between coding performance and coding speed, and may allow for parallel processing of bins of a sub-set.

In other examples, according to aspects of this disclosure, video encoder 20 and/or video decoder 30 may perform other techniques for parallelized entropy coding. For example, video encoder 20 and/or video decoder 30 may code a bin of a block of video data using a probability model that is updated prior to coding a previous bin of the block. That is, video encoder 20 and/or video decoder 30 may update a probability model at least two coding iterations, or cycles, prior to coding a current bin. Accordingly, video encoder 20 and/or video decoder 30 may avoid delays that result from updating a probability model after coding a bin using the model, when multiple consecutive bins are coded using the model.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

Figure 2:
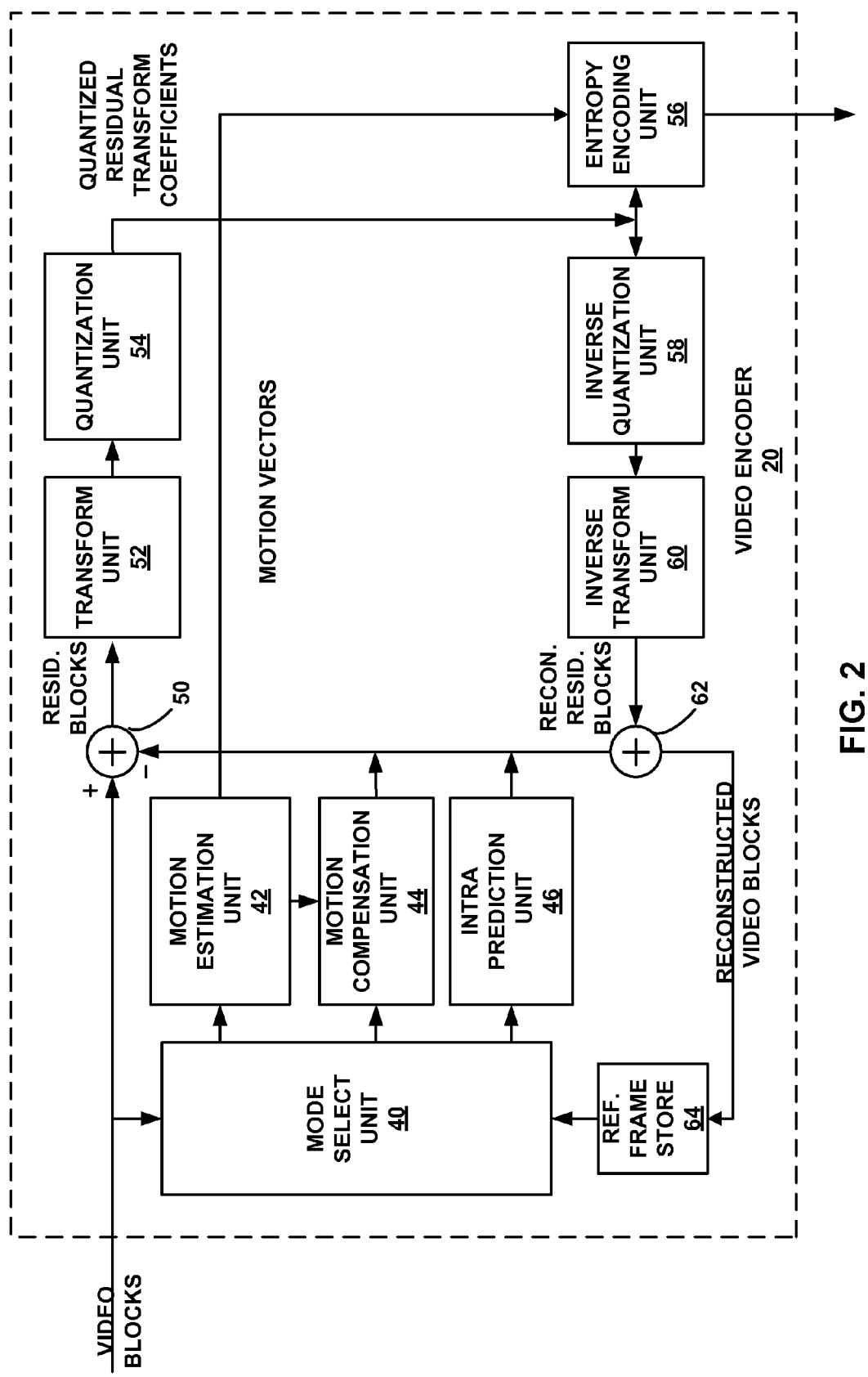
FIG. 2 is a block diagram illustrating an example of a video encoder that may implement any or all of the techniques of this disclosure.

FIG. 2 is a block diagram illustrating an example of video encoder 20 that may implement the techniques of this disclosure for context adaptive coding. It should be understood that certain components of FIG. 2 may be shown and described with respect to a single component for conceptual purposes, but may include one or more functional units. In addition, while certain components of FIG. 2 may be shown and described with respect to a single component, such components may be physically comprised of one or more than one discrete and/or integrated units.

As shown in FIG. 2, video encoder 20 receives a current video block within a video picture to be encoded. In the example of FIG. 2, video encoder 20 includes motion compensation unit 44, motion estimation unit 42, reference frame store 64, summer 50, transform unit 52, quantization unit 54, and entropy encoding unit 56. For video block reconstruction, video encoder 20 also includes inverse quantization unit 58, inverse transform unit 60, and summer 62. A deblocking filter (not shown in FIG. 2) may also be included to filter block boundaries to remove blockiness artifacts from reconstructed video. If desired, the deblocking filter would typically filter the output of summer 62.

During the encoding process, video encoder 20 receives a video picture or slice to be coded. The picture or slice may be divided into multiple video blocks. Motion estimation unit 42 and motion compensation unit 44 perform inter-predictive coding of the received video block relative to one or more blocks in one or more reference frames. That is, motion estimation unit 42 may perform inter-predictive coding of the received video block relative to one or more blocks in one or more reference frames of a different temporal instance, e.g., motion estimation using one or more reference frames of the same view. In addition, motion estimation unit 42 may perform inter-predictive coding of the received video block relative to one or more blocks in one or more reference frames of the same temporal instance, e.g., motion disparity using one or more reference frames of a different view.

Intra prediction unit 46 may perform intra-predictive coding of the received video block relative to one or more neighboring blocks in the same frame or slice as the block to be coded to provide spatial compression. Mode select unit 40 may select one of the coding modes, intra or inter, e.g., based on error results, and provides the resulting intra- or inter-coded block to summer 50 to generate residual block data and to summer 62 to reconstruct the encoded block for use in a reference frame.

Motion estimation unit 42 and motion compensation unit 44 may be highly integrated, but are illustrated separately for conceptual purposes. Motion estimation is the process of generating motion vectors, which estimate motion for video blocks. A motion vector, for example, may indicate the displacement of a predictive block within a predictive reference frame (or other coded unit) relative to the current block being coded within the current frame (or other coded unit). A predictive block is a block that is found to closely match the block to be coded, in terms of pixel difference, which may be determined by sum of absolute difference (SAD), sum of square difference (SSD), or other difference metrics. A motion vector may also indicate displacement of a partition of a macroblock. Motion compensation may involve fetching or generating the predictive block based on the motion vector (or displacement vector) determined by motion estimation unit 42. Again, motion estimation unit 42 and motion compensation unit 44 may be functionally integrated, in some examples.

Motion estimation unit 42 may calculate a motion vector for a video block of an inter-coded picture by comparing the video block to video blocks of a reference frame in reference frame store 64. Motion compensation unit 44 may also interpolate sub-integer pixels of the reference frame, e.g., an I-frame or a P-frame. The ITU-T H.264 standard refers to "lists" of reference frames, e.g., list 0 and list 1. List 0 includes reference frames having a display order earlier than the current picture, while list 1 includes reference frames having a display order later than the current picture. In other coding schemes, a single list may be maintained.

Motion estimation unit 42 compares blocks of one or more reference frames from reference frame store 64 to a block to be encoded of a current picture, e.g., a P-picture or a B-picture. When the reference frames in reference frame store 64 include values for sub-integer pixels, a motion vector calculated by motion estimation unit 42 may refer to a sub-integer pixel location of a reference frame. Motion estimation unit 42 sends the calculated motion vector to entropy encoding unit 56 and motion compensation unit 44. The reference frame block identified by a motion vector may be referred to as a predictive block. Motion compensation unit 44 calculates residual error values for the predictive block of the reference frame.

Transform unit 52 applies a transform, such as a discrete cosine transform (DCT), integer transform, or a conceptually similar transform, to the residual block, producing a video block comprising residual transform coefficient values. Transform unit 52 may perform other transforms, such as those defined by the H.264 standard, which are conceptually similar to DCT. Wavelet transforms, integer transforms, sub-band transforms or other types of transforms could also be used. In any case, transform unit 52 applies the transform to the residual block, producing a block of residual transform coefficients. Transform unit 52 may convert the residual information from a pixel value domain to a transform domain, such as a frequency domain.

Quantization unit 54 quantizes the residual transform coefficients to further reduce bit rate. The quantization process may reduce the bit depth associated with some or all of the coefficients. The degree of quantization may be modified by adjusting a quantization parameter. For example, quantization generally involves mapping values within a relatively large range to values in a relatively small range, thus reducing the amount of data needed to represent the quantized transform coefficients. The video encoder may quantize the transform coefficients by applying a quantization parameter (QP) according to a predefined algorithm. The video encoder may modify the degree of quantization applied to the transform coefficient values by adjusting the QP.

Following quantization, entropy encoding unit 56 scans and entropy codes the quantized transform coefficients. Entropy encoding unit 56 may perform CAVLC, CABAC, PIPE, or another entropy coding technique. Entropy encoding unit 56 may perform any of the techniques of this disclosure when performing entropy coding.

For example, according to aspects of this disclosure, entropy encoding unit 56 may update probability models used during entropy coding after coding a predetermined sub-set of transform coefficients associated with a block of video data. For example, entropy encoding unit 56 may divide transform coefficients associated with a block of video data into a plurality of sub-sets. Entropy encoding unit 56 may continue to code each sub-set of the block until the entire block has been coded. According to aspects of this disclosure, entropy encoding unit 56 may update probabilities associated with contexts after coding of each sub-set. For example, entropy encoding unit 56 may collect and store statistics associated with the probability models that are applied while coding a sub-set of transform coefficients. After coding the sub-set, entropy encoding unit 56 may update the probability models for each context used during the coding of the sub-set using the stored probability statistics. Entropy encoding unit 56 may use the updated probabilities for coding the next sub-set of transform coefficients. In this way, entropy encoding unit 56 may code transform coefficients of each sub-set without updating the probabilities during the coding of the sub-sets. In this way, the techniques of this disclosure may strike a balance between coding performance and coding speed, and may allow for parallel processing of bins of a sub-set.

Additionally or alternatively, according to aspects of this disclosure, entropy encoding unit 56 may perform other techniques for parallelized entropy coding. For example, entropy encoding unit 56 may code a bin of a block of video data using a probability model that is updated prior to coding a previous bin of the block. That is, entropy encoding unit 56 may update a probability model at least two coding iterations, or cycles, prior to coding a current bin. Accordingly, entropy encoding unit 56 may avoid delays that result from updating a probability model after coding a bin using the model, when multiple consecutive bins are coded using the model.

In some cases, entropy encoding unit 56 or another unit of video encoder 20 may also be configured to perform other coding functions, in addition to entropy coding. For example, entropy encoding unit 56 may be configured to determine the coded block pattern (CBP) values for the CUs and/or PUs. Also, in some cases, entropy encoding unit 56 may perform run length coding of the coefficients in a macroblock or partition thereof. Entropy encoding unit 56 also may construct header information with appropriate syntax elements for transmission in the encoded video bitstream.

Inverse quantization unit 58 and inverse transform unit 60 apply inverse quantization and inverse transformation, respectively, to reconstruct the residual block in the pixel domain, e.g., for later use as a reference block. Motion compensation unit 44 may calculate a reference block by adding the residual block to a predictive block of one of the frames of reference frame store 64. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reconstructed video block for storage in reference frame store 64. The reconstructed video block may be used by motion estimation unit 42 and motion compensation unit 44 as a reference block to inter-code a block in a subsequent video frame.

Figure 3:
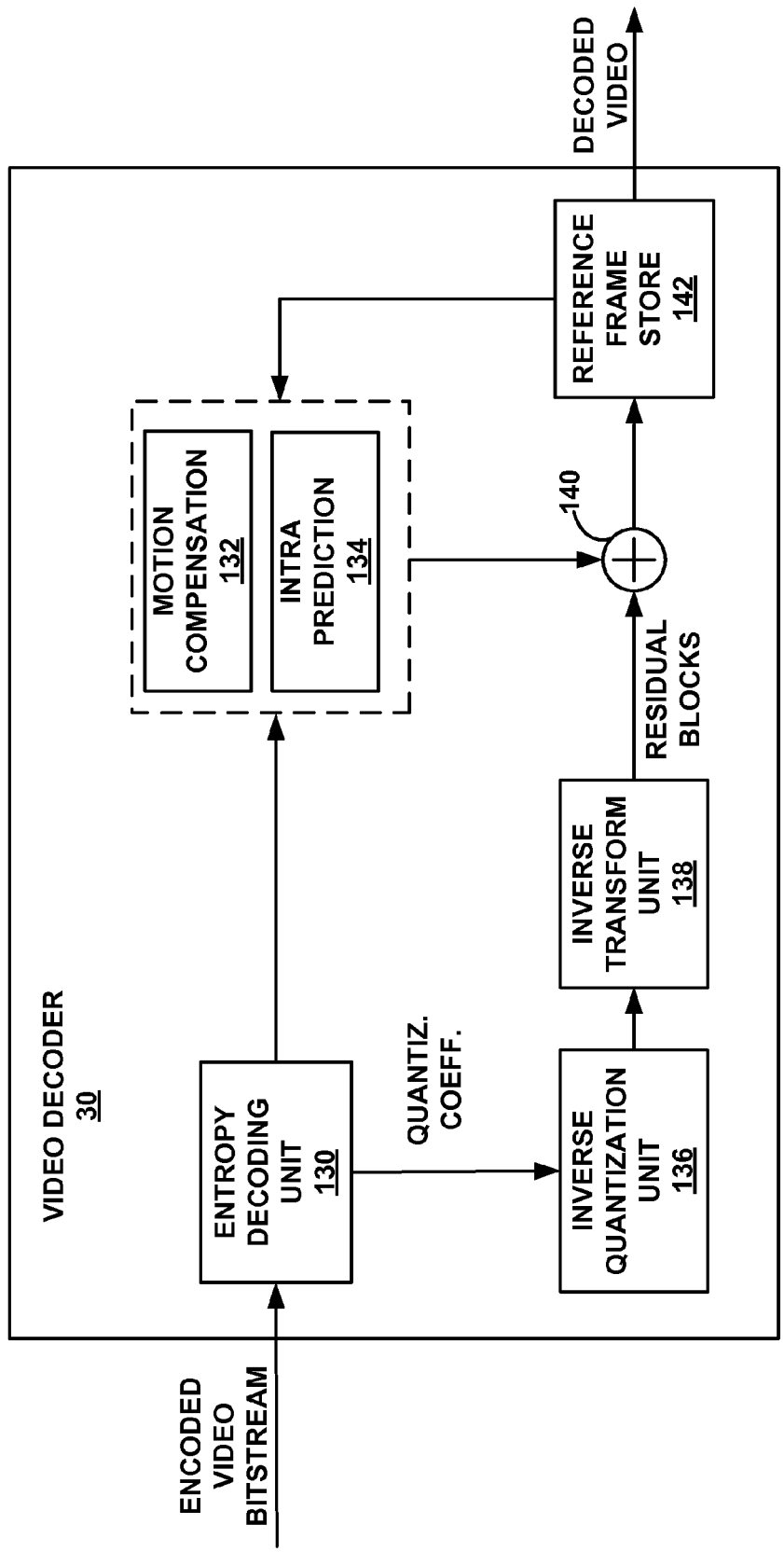
FIG. 3 is a block diagram illustrating an example of a video decoder, which decodes an encoded video sequence.

FIG. 3 is a block diagram illustrating an example of video decoder 30, which decodes an encoded video sequence. In the example of FIG. 3, video decoder 30 includes an entropy decoding unit 130, motion compensation unit 132, intra prediction unit 134, inverse quantization unit 136, inverse transformation unit 138, reference frame store 142 and summer 140.

Entropy decoding unit 130 may entropy decode a received bitstream. For example, entropy decoding unit 130 may receive serialized transform coefficients and inverse scan the transform coefficients to generate a two dimensional array of transform coefficients. Entropy decoding unit 130 may implement any of the techniques of this disclosure.

For example, according to aspects of this disclosure, entropy decoding unit 130 may update probability models used during entropy decoding after decoding a predetermined sub-set of transform coefficients associated with a block of video data. For example, entropy decoding unit 130 may divide transform coefficients associated with a block of video data into a plurality of sub-sets. Entropy decoding unit 130 may continue to decode each sub-set of the block until the entire block has been decoded. According to aspects of this disclosure, entropy decoding unit 130 may update probabilities associated with contexts after decoding of each sub-set. For example, entropy decoding unit 130 may collect and store statistics associated with the probability models that are applied while decoding a sub-set of transform coefficients. After decoding the sub-set, entropy decoding unit 130 may update the probability models for each context used during the decoding of the sub-set using the stored probability statistics. Entropy decoding unit 130 may use the updated probabilities for decoding the next sub-set of transform coefficients. In this way, entropy decoding unit 130 may decode transform coefficients of each sub-set without updating the probabilities during the decoding of the sub-sets. In this way, the techniques of this disclosure may strike a balance between coding performance and decoding speed, and may allow for parallel processing of bins of a sub-set.

Additionally or alternatively, according to aspects of this disclosure, entropy decoding unit 130 may perform other techniques for parallelized entropy coding. For example, entropy decoding unit 130 may decode a bin of a block of video data using a probability model that is updated prior to coding a previous bin of the block. That is, entropy decoding unit 130 may update a probability model at least two coding iterations, or cycles, prior to decoding a current bin. Accordingly, entropy decoding unit 130 may avoid delays that result from updating a probability model after decoding a bin using the model, when multiple consecutive bins are decoded using the model.

Motion compensation unit 132 may generate prediction data based on motion vectors received from entropy decoding unit 130. Motion compensation unit 132 may use motion vectors received in the bitstream to identify a prediction block in reference frames in reference frame store 142. Intra prediction unit 134 may use intra prediction modes received in the bitstream to form a prediction block from spatially adjacent blocks.

Inverse quantization unit 136 inverse quantizes, i.e., de-quantizes, the quantized block coefficients provided in the bitstream and decoded by entropy decoding unit 130. According to some aspects of this disclosure, inverse quantization unit 136 may be configured to operate in a manner generally reciprocal to that of quantization unit 54 described above with respect to the video encoder 20 shown in the example of FIG. 2.

Inverse transform unit 158 applies an inverse transform, e.g., an inverse DCT, an inverse integer transform, or a conceptually similar inverse transform process, to the transform coefficients in order to produce residual blocks in the pixel domain. Motion compensation unit 132 produces motion compensated blocks, possibly performing interpolation based on interpolation filters. Identifiers for interpolation filters to be used for motion estimation with sub-pixel precision may be included in the syntax elements. Motion compensation unit 132 may use interpolation filters as used by video encoder 20 during encoding of the video block to calculate interpolated values for sub-integer pixels of a reference block. Motion compensation unit 132 may determine the interpolation filters used by video encoder 20 according to received syntax information and use the interpolation filters to produce predictive blocks.

Motion compensation unit 132 uses some of the syntax information to determine sizes of macroblocks used to encode frame(s) of the encoded video sequence, partition information that describes how each macroblock of a frame of the encoded video sequence is partitioned, modes indicating how each partition is encoded, one or more reference frames (or lists) for each inter-encoded macroblock or partition, and other information to decode the encoded video sequence.

Summer 140 sums the residual blocks with the corresponding prediction blocks generated by motion compensation unit 132 or intra-prediction unit to form decoded blocks. If desired, a deblocking filter may also be applied to filter the decoded blocks in order to remove blockiness artifacts. The decoded video blocks are then stored in reference frame store 142, which provides reference blocks for subsequent motion compensation and also produces decoded video for presentation on a display device (such as display device 32 of FIG. 1).

Figure 4A:
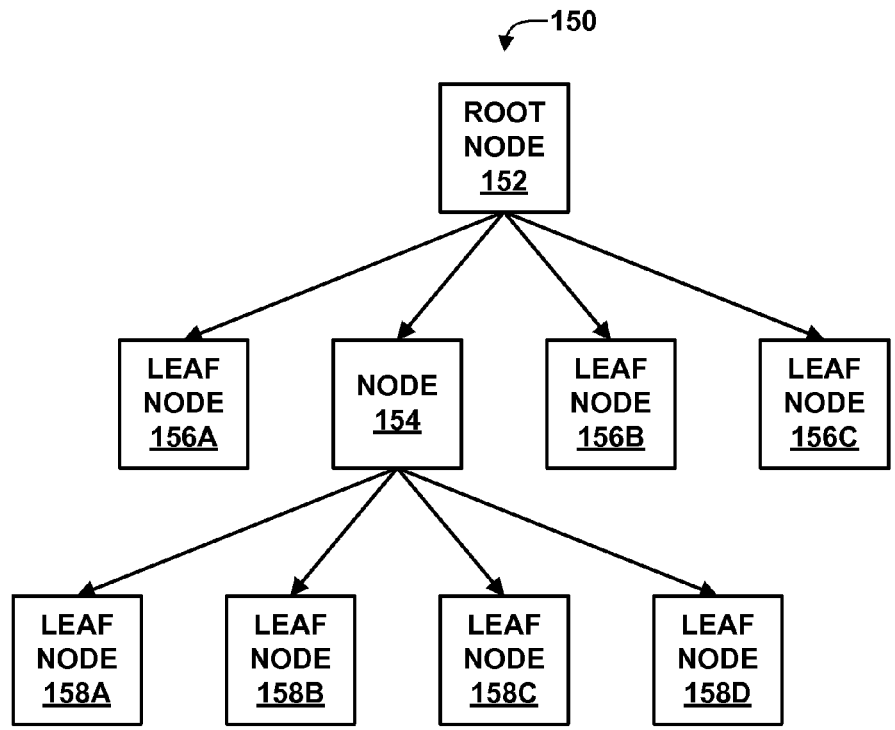
FIGS. 4A and 4B are conceptual diagrams illustrating an example quadtree and a corresponding largest coding unit (LCU).
Figure 4B:
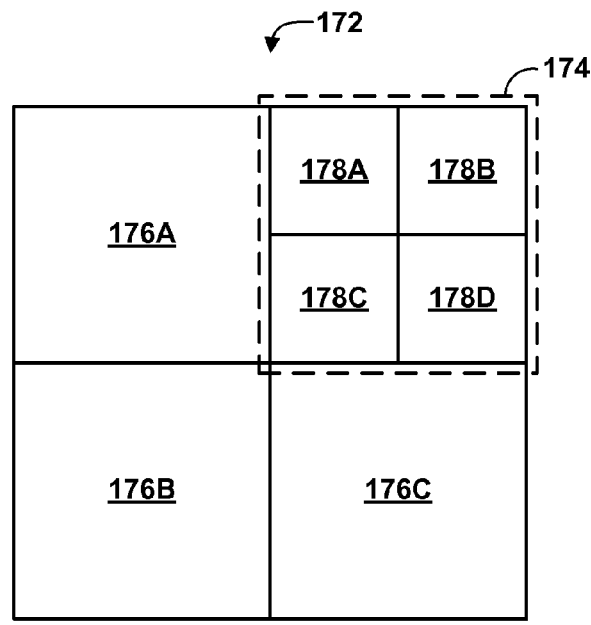

FIGS. 4A and 4B are conceptual diagrams illustrating an example quadtree 150 and a corresponding largest coding unit 172. FIG. 4A depicts an example quadtree 150, which includes nodes arranged in a hierarchical fashion. The quadtree 150 may be associated with, for example, a treeblock according to the proposed HEVC standard. Each node in a quadtree, such as quadtree 150, may be a leaf node with no children, or have four child nodes. In the example of FIG. 4A, quadtree 150 includes root node 152. Root node 152 has four child nodes, including leaf nodes 156A-156C (leaf nodes 156) and node 154. Because node 154 is not a leaf node, node 154 includes four child nodes, which in this example, are leaf nodes 158A-158D (leaf nodes 158).

Quadtree 150 may include data describing characteristics of a corresponding largest coding unit (LCU), such as LCU 172 in this example. For example, quadtree 150, by its structure, may describe splitting of the LCU into sub-CUs. Assume that LCU 172 has a size of 2N×2N. LCU 172, in this example, has four sub-CUs 176A-176C (sub-CUs 176) and 174, each of size N×N. Sub-CU 174 is further split into four sub-CUs 178A-178D (sub-CUs 178), each of size N/2×N/2. The structure of quadtree 150 corresponds to the splitting of LCU 172, in this example. That is, root node 152 corresponds to LCU 172, leaf nodes 156 correspond to sub-CUs 176, node 154 corresponds to sub-CU 174, and leaf nodes 158 correspond to sub-CUs 178.

Data for nodes of quadtree 150 may describe whether the CU corresponding to the node is split. If the CU is split, four additional nodes may be present in quadtree 150. In some examples, a node of a quadtree may be implemented similar to the following pseudocode:

```
quadtree_node {
    boolean split_flag(1);
    // signaling data
    if (split_flag) {
        quadtree_node child1;
        quadtree_node child2;
        quadtree_node child3;
        quadtree_node child4;
    }
}
```

The split_flag value may be a one-bit value representative of whether the CU corresponding to the current node is split. If the CU is not split, the split_flag value may be '0', while if the CU is split, the split_flag value may be '1'. With respect to the example of quadtree 150, an array of split flag values may be 101000000.

In some examples, each of sub-CUs 176 and sub-CUs 178 may be intra-prediction encoded using the same intra-prediction mode. Accordingly, video encoder 20 may provide an indication of the intra-prediction mode in root node 152.

While FIG. 4A illustrates an example of a CU quadtree, it should be understood that a similar quadtree may be applied to TUs of a leaf-node CU. That is, a leaf-node CU may include a TU quadtree that describes partitioning of TUs for the CU. A TU quadtree may generally resemble a CU quadtree, except that the TU quadtree may signal intra-prediction modes for TUs of the CU individually.

Figure 5A:
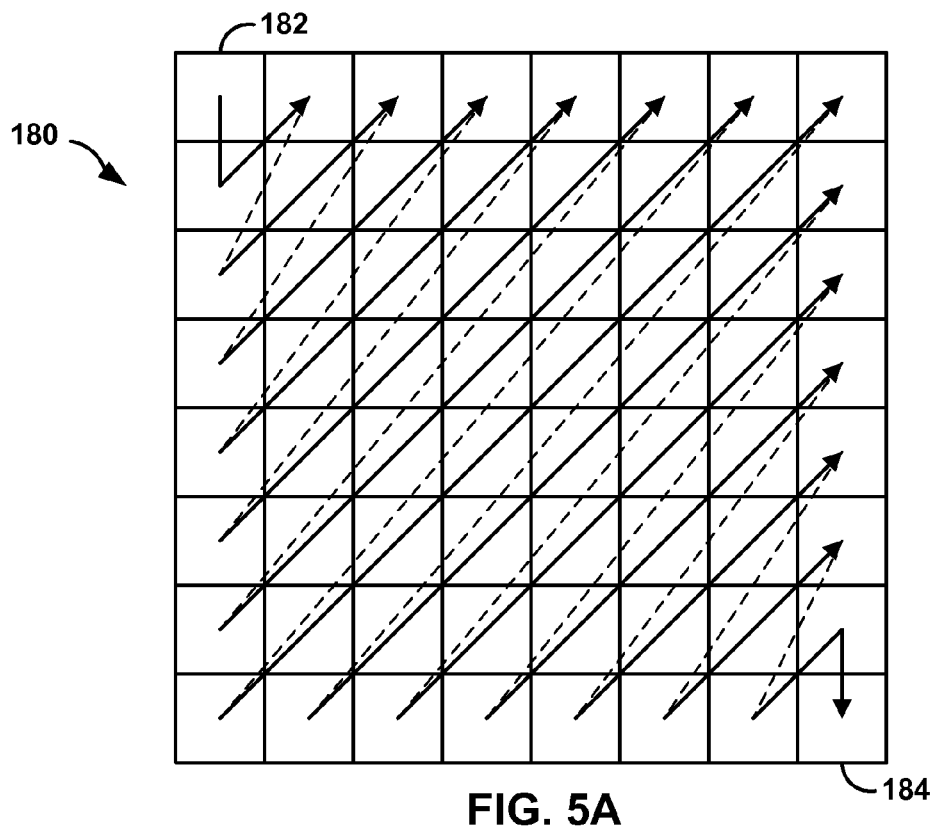
FIG. 5A is a conceptual diagram illustrating an example forward diagonal scan pattern for scanning transform coefficients of a block of video data.
Figure 5B:
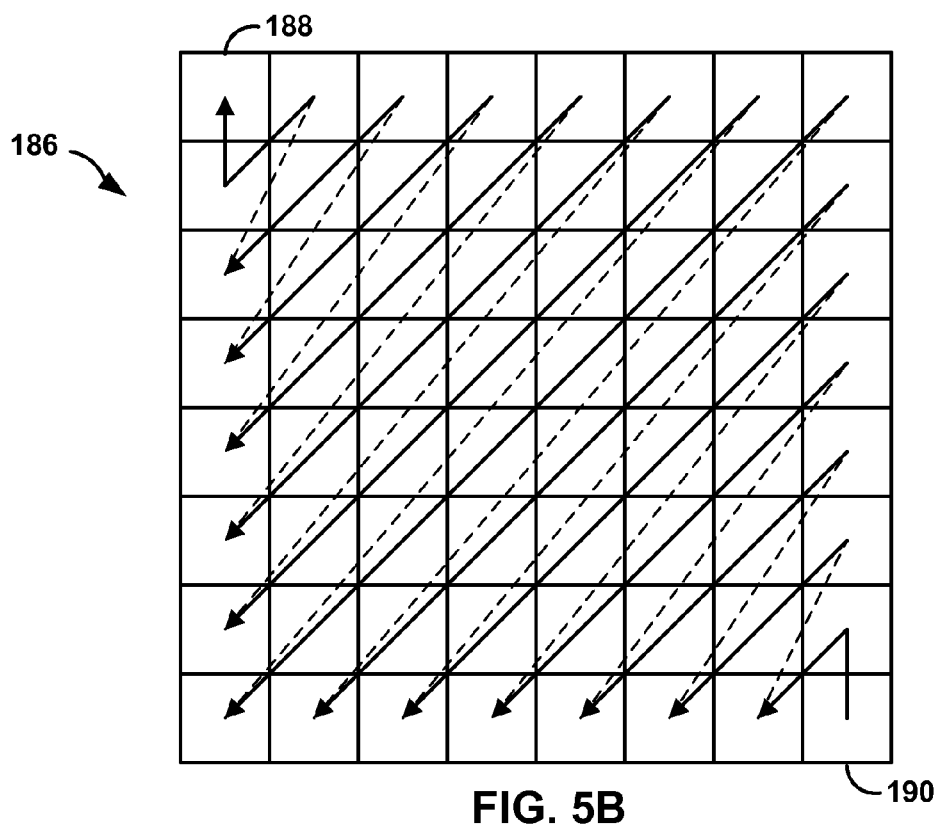
FIG. 5B is a conceptual diagram illustrating an example reverse diagonal scan pattern for scanning transform coefficients of a block of video data.

FIGS. 5A and 5B generally illustrate diagonal scan patterns for scanning transform coefficients associated with a block of video data during entropy coding. That is, for example, the scan patterns may be used by a video encoder (such as video encoded 20 when serializing a two-dimensional array of transform coefficients. In another example, the scan patterns may be used by a video decoder (such as video decoder 30) when reconstructing a block of video data from a received serialized array of coded transform coefficients.

For example, FIG. 5A illustrates a forward diagonal scan pattern 180 for scanning transform coefficients of a block of video data (e.g., transform coefficients associated with a TU). In general, the forward diagonal scan pattern 180 traverses the block at a 45 degree angle from left to right and from top to bottom. That is, in the example shown in FIG. 5A, a first coefficient 182 is a DC component positioned at the upper left corner of the block, while a last coefficient 184 to be scanned is positioned at the bottom right corner of the block.

FIG. 5B illustrates a reverse diagonal scan pattern 186 for scanning transform coefficients of a block of video data (e.g., transform coefficients associated with a TU). In general, the reverse diagonal scan pattern 186 traverses the block at a 45 degree angle from right to left and from bottom to top. That is, in the example shown in FIG. 5B, a first coefficient 188 is a DC component positioned at the lower right corner of the block, while a last coefficient 190 to be scanned is positioned at the top left corner of the block.

It should be understood that the scan pattern shown in FIGS. 5A and 5B are provided for purposes of illustration only. For example, while FIGS. 5A and 5B illustrate a diagonal scan pattern, there may be other scan patterns available, such as a zig-zag pattern, an adaptive scan order, a horizontal pattern, and a vertical pattern, and the like. In addition, different components associated with transform coefficients (e.g., significance, sign, level, and the like) may be scanned using patterns of different orientations and/or directions. For example, in some instances, significance information (e.g., a significance map) may be scanned in the opposite direction of transform coefficient levels. In other instances, a unified scanning pattern may be implemented, such that significance information and transform coefficient levels are scanned in the same direction.

Figure 6A:
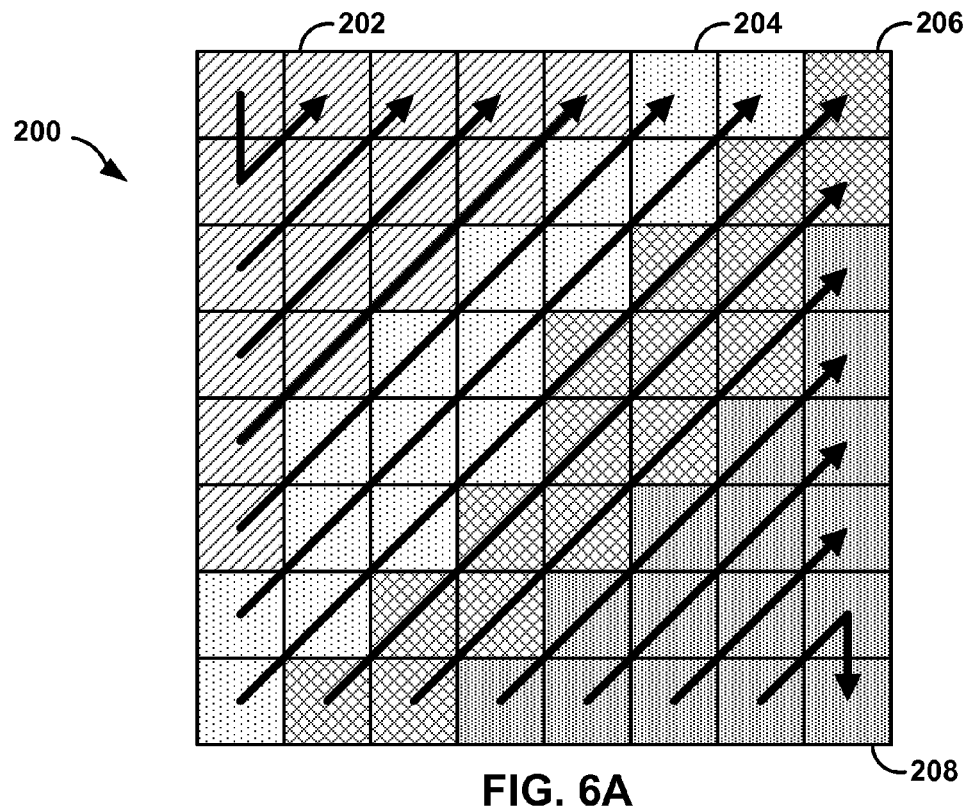
FIG. 6A is an example conceptual diagram illustrating dividing a block of transform coefficients in to sub-sets.
Figure 6B:
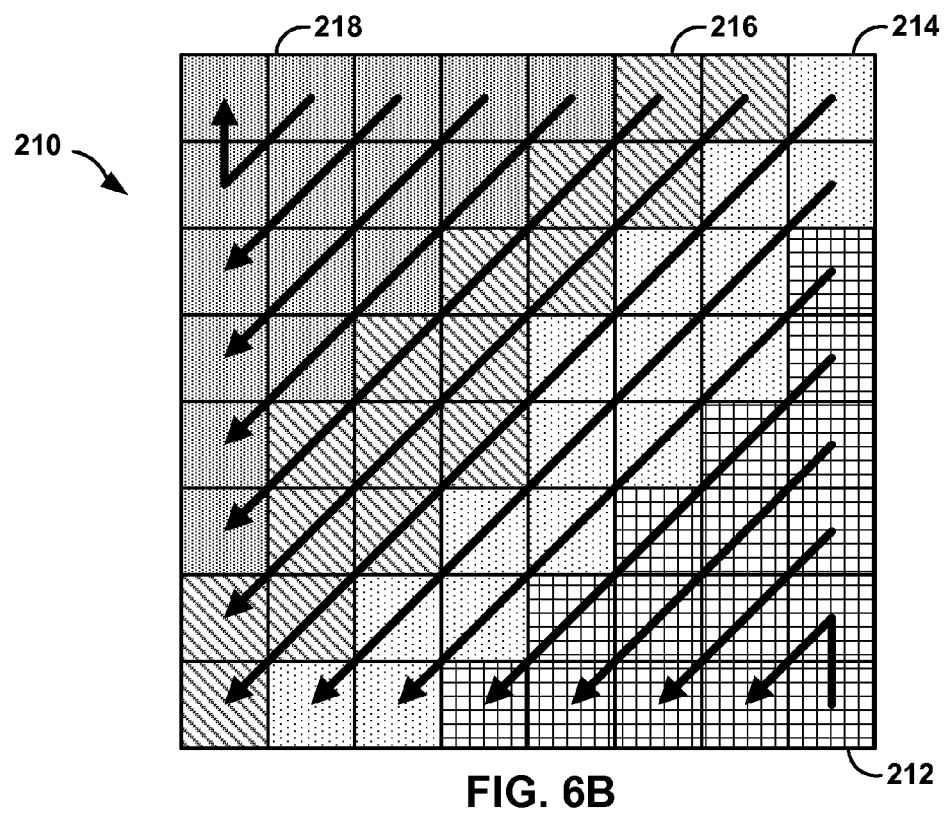
FIG. 6B is another example conceptual diagram illustrating dividing a block of transform coefficients in to sub-sets.

FIGS. 6A and 6B generally illustrate dividing a block of transform coefficients in to sub-sets, according to aspects of this disclosure. While FIGS. 6A and 6B are described with respect to video decoder 30 (FIGS. 1 and 3), it should be understood that the techniques of this disclosure may be carried out by a variety of other video coders, including video encoder 20 (FIGS. 1 and 2), other processors, processing units, hardware-based coding units such as encoder/decoders (CODECs), and the like.

With respect to FIG. 6A, according to aspects of this disclosure, video decoder 30 may divide block 200 into sub-sets 202, 204, 206, and 208 in scanning order while decoding block 200. In the example shown in FIG. 6A, first sub-set 202 includes the first 16 transform coefficients in scanning order, a second sub-set 204 includes the next 16 transform coefficients in scanning order a third sub-set 206 includes the next 16 transform coefficients in scanning order, and a fourth sub-set 208 includes the final 16 transform coefficients in scanning order.

According to aspects of this disclosure, video decoder 30 may link probability updating associated with a context adaptive coding process with the sub-sets 202-208. For example, during decoding of block 200, video decoder 30 may initially decode sub-set 202 using a first set of probability models. The first set of probability models may not be updated during the coding of sub-set 202, such that video decoder 30 decodes the entire sub-set 202 using the first set of probability models. In addition, video decoder 30 may collect and store statistics associated with the first set of probability models that are applied while decoding sub-set 202. For example, as noted above, context, which indicates a particular probability model for coding a bin, may be influenced by values of previously coded bins, e.g., related bins of previously coded syntax elements. In addition, the probability model used to code the bin may also be influenced by values of previously coded bins. According to aspects of this disclosure, rather than updating probability models in a serial manner, e.g., on a bin by bin basis, the video decoder 30 may store an updated state of context based on the coded bin.

According to aspects of this disclosure, after decoding sub-set 202, video decoder 30 may update the first set of probability models using the stored probability statistics. Video decoder 30 may then use this updated, second set of probability models for decoding the second sub-set 204 of transform coefficients. Video decoder 30 may continue decoding block 200 in this way until block 200 has been decoded. That is, after decoding the second sub-set 204, video decoder 30 may update probability models using statistics stored during the decoding of the second sub-set, and use the updated probability model to decode the third sub-set 206. Moreover, video decoder 30 may perform the same process to decode the fourth sub-set 208.

In some examples, rather than waiting to update the probability models until after all of the bins of a particular sub-set have been coded, video decoder 30 may update probabilities after each coding pass of each sub-set. In this example, video decoder 30 may parallelize the updating process of the probability models of one pass within the sub-set with other passes of the sub-set. For example, the video coder may update the probabilities for the bins of the significance information for a sub-set of transform coefficients while coding bin 1 of coefficient levels during another coding pass of the sub-set. In this example, the contexts of one pass may not be used for coding the other passes within the sub-set.

In other examples, video decoder 30 may update the probabilities after coding a predetermined number of bins of a sub-set. For example, video decoder 30 may code the significance map prior to coding the transform coefficient levels. In such an example, video decoder 30 may decode the significance map and update the probabilities after decoding the significance map. Video decoder 30 may then decode the remaining information associated with the transform coefficients (e.g., sign, levels, and the like). In examples in which video decoder 30 decodes both a last_x and a last_y syntax element, video decoder 30 may update the probabilities after decoding both the last_x and the last_y of the last significant coefficient, or may update the probabilities after decoding each of the last_x and the last_y.

In a similar manner as described with respect to FIG. 6A, video decoder 30 may divide block 210 of FIG. 6B into sub-sets 212, 214, 216, and 218 in scanning order. That is, in the example shown in FIG. 6B, a first sub-set 212 includes the first 16 transform coefficients in scanning order, a second sub-set 214 includes the next 16 transform coefficients in scanning order, a third sub-set 216 includes the next 16 transform coefficients in scanning order, and a fourth sub-set 218 includes the final 16 transform coefficients in scanning order. Video decoder 30 may then perform a similar probability model updating process as described with respect to FIG. 6A.

While the examples shown in FIGS. 6A and 6B generally illustrate a diagonal scan pattern, as noted above with respect to FIGS. 5A and 5B, a variety of other scan patterns may be used, such as a zig-zag pattern, an adaptive scan order, a horizontal pattern, a vertical pattern, and the like.

In addition, while the examples shown in FIGS. 6A and 6B illustrate 8×8 blocks of transform coefficients with sub-sets that include 16 transform coefficients, it should be understood that the techniques of this disclosure may be applied to blocks of other sizes and sub-sets having any number of transform coefficients. For example, a sub-set may be any set of n transform coefficients of a transform unit (TU), where n is some number smaller than the number of transform coefficients of the TU. In other examples for purposes of illustration, a 32×32 block of transform coefficients may be divided into 32 sub-sets, with each subset having 32 transform coefficients, or an 8×8 block of transform coefficients may be divided into two sub-sets, with each sub-set having 32 transform coefficients. Other examples are also possible.

For example, a sub-set may include 16 consecutive coefficients in any continuous scan order (e.g., horizontal, vertical, diagonal, adaptive, or some other scan order).

Figure 7A:
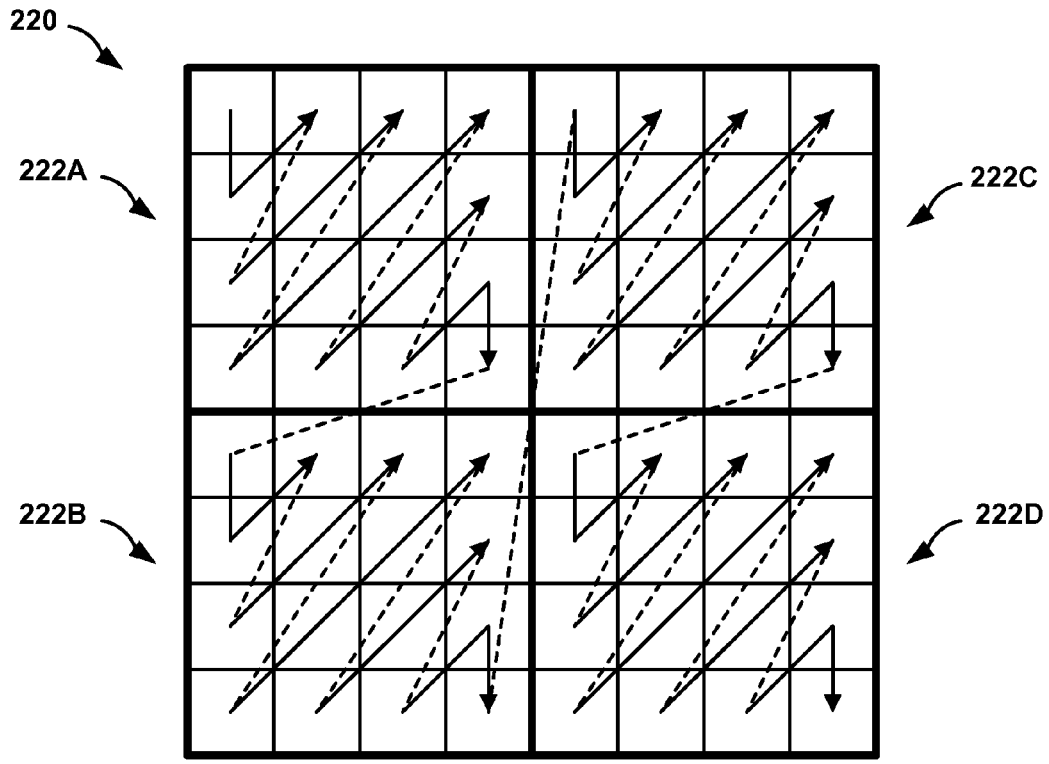
FIG. 7A is an example conceptual diagram illustrating dividing a block of transform coefficients associated with a block of video data into sub-sets in the form of sub-blocks.
Figure 7B:
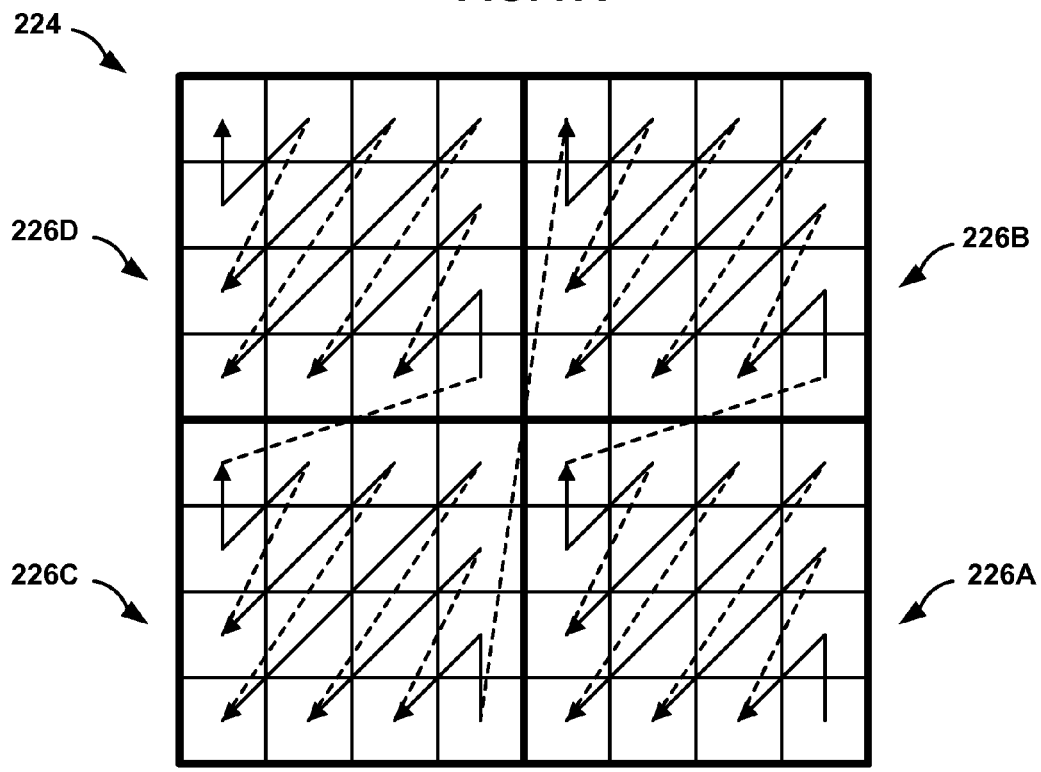
FIG. 7B is another example conceptual diagram illustrating dividing a block of transform coefficients associated with a block of video data into sub-sets in the form of sub-blocks.

FIGS. 7A and 7B generally illustrate dividing a block of transform coefficients associated with a block of video data into sub-sets in the form of sub-blocks, according to aspects of this disclosure. While FIGS. 7A and 7B are described with respect to video decoder 30 (FIGS. 1 and 3), it should be understood that the techniques of this disclosure may be carried out by a variety of other video coders, including video encoder 20 (FIGS. 1 and 2), other processors, processing units, hardware-based coding units such as encoder/decoders (CODECs), and the like.

With respect to FIG. 7A, according to aspects of this disclosure, video decoder 30 may divide block 220 into sub-blocks 222A, 222B, 222C, and 222D (collectively, sub-blocks 222) while decoding block 220. In the example shown in FIG. 7A, first sub-block 222A includes a 4×4 block of transform coefficients positioned in the upper left corner of block 220, a second sub-block 222B includes a 4×4 block of transform coefficients positioned in the lower left corner of block 220, a third sub-block 222C includes a 4×4 block of transform coefficients positioned in the upper right corner of block 220, and a fourth sub-block 222D includes a 4×4 block of transform coefficients positioned in the lower right corner of block 220.

In some examples, video decoder 30 may use a unified scan for scanning transform coefficients of sub-blocks 222. For example, video decoder 30 may scan significance information (e.g., a significance map) and coefficient levels using the diagonal scan shown in FIG. 7A. In other examples, video decoder 30 may scan components of transform coefficients (e.g., significance, sign, levels, and the like) using reverse scans or scans having other orientations. For example, video decoder 30 may map absolute values of transform coefficient levels maps of each square (or rectangular) 8×8 block and larger onto an ordered set (e.g., vector) of 4×4 sub-blocks by using a forward zig-zag scan. Video decoder 30 may then process the transform coefficient levels inside each 4×4 sub-block in a reverse zig-zag scan to produce a vector of transform coefficient levels.

In some examples, to code sub-blocks 222, video decoder 30 may perform a first pass to code significance information. Video decoder 30 may then perform another pass to decode the bin 1 of the transform coefficient levels, another pass to decode the remaining bins of the transform coefficient levels, and another pass to decode the sign of the transform coefficient levels. Upon finishing one of the sub-blocks 222, video decoder 30 may perform the decoding passes for the next sub-block until block 220 has been fully decoded. In other examples, an alternative number of coding passes may be implemented.

According to aspects of this disclosure, video decoder 30 may link probability updating associated with a context adaptive coding process with sub-blocks 222. For example, during decoding of block 220, video decoder 30 may initially decode sub-block 222A using a first set of probability models. The first set of probability models may not be updated during the decoding of sub-block 222A, such that video decoder 30 decodes the entire sub-block 222A using the first set of probability models. In addition, video decoder 30 may collect and store statistics (e.g., the state of context) associated with the first set of probability models that are applied while decoding sub-block 222A.

According to aspects of this disclosure, after coding sub-block 222A, video decoder 30 may update the first set of probability models using the stored probability statistics. Video decoder 30 may then use this updated, second set of probability models for decoding the second sub-block 222B of transform coefficients. Video decoder 30 may continue decoding block 220 in this way until block 220 has been decoded. That is, after decoding the second sub-block 222B, video decoder 30 may update probability models using statistics stored during the decoding of the second sub-block, and use the updated probability model to decode the third sub-block 222C. Moreover, video decoder 30 may perform the same process to decode the fourth sub-block 222D.

In some examples, rather than waiting to update the probability models until after all of the bins of a particular sub-set have been coded, video decoder 30 may update probabilities after each coding pass of each sub-set. In this example, video decoder 30 may parallelize the updating process of the probability models of one pass within the sub-set with other passes of the sub-set.

In other examples, video decoder 30 may update the probabilities after coding a predetermined number of bins of a sub-set. For example, video decoder 30 may code the significance map prior to coding the transform coefficient levels. In such an example, video decoder 30 may decode the significance map and update the probabilities after coding the significance map. Video decoder 30 may then decode the remaining information associated with the transform coefficients (e.g., sign, levels, and the like). In examples in which video decoder 30 decodes both a last_x and a last_y syntax element, video decoder 30 may update the probabilities after decoding both the last_x and the last_y of the last significant coefficient, or may update the probabilities after decoding each of the last_x and the last_y.

In a similar manner as described with respect to FIG. 7A, video decoder 30 may divide block 224 of FIG. 7B into sub-blocks 226A, 226B, 226C, and 226D while decoding block 220. In the example shown in FIG. 7B, first sub-block 226A includes a 4×4 block of transform coefficients positioned in the lower right corner of block 224, a second sub-block 226B includes a 4×4 block of transform coefficients positioned in the upper right corner of block 224, a third sub-block 226C includes a 4×4 block of transform coefficients positioned in the lower left corner of block 224, and a fourth sub-block 226D includes a 4×4 block of transform coefficients positioned in the upper left corner of block 224.

To facilitate the inverse scan shown in FIG. 7B (with respect to FIG. 7A), in some examples, video decoder 30 may first identify the last significant coefficient of block 224. After identifying the last significant coefficient, video coder 30 may apply the scan shown in FIG. 7B, and may then perform a similar probability model updating process as described with respect to FIG. 7A.

While the examples shown in FIGS. 7A and 7B generally illustrate a diagonal scan pattern, as noted above with respect to FIGS. 5A and 5B, a variety of other scan patterns may be used, such as a zig-zag pattern, an adaptive scan order, a horizontal pattern, a vertical pattern, and the like.

In addition, while the examples shown in FIGS. 7A and 7B illustrate 8×8 blocks of transform coefficients with 4×4 sub-blocks, it should be understood that the techniques of this disclosure may be applied to blocks of other sizes, as well as sub-blocks of other sizes. For example, a sub-block may include any n×n block of transform coefficients of a transform unit (TU), where n×n is smaller than the size of the TU. In addition, sub-blocks of equal sizes, as shown in FIGS. 7A and 7B, may provide certain help to achieve hardware efficiency (e.g., hardware may be optimized to work with a static sub-block size). However, in other examples, the techniques of this disclosure may be applied to sub-blocks having different sizes.

Moreover, FIGS. 7A and 7B illustrate sub-blocks 222 and sub-blocks 226 being scanned in a generally zig-zag pattern. That is, in the example shown in FIG. 7A, the scanning of sub-block 222A is followed by the scanning of sub-block 222B, which is followed by the scanning of sub-block 222C and 222D. In the example shown in FIG. 7B, the scanning of sub-block 226A is followed by the scanning of sub-block 226B, which is followed by the scanning of sub-block 226C and 226D. However, it should be understood that FIGS. 7A and 7B are provided for purposes of example only. That is, in other examples, sub-blocks 222 and sub-blocks 226 may be scanned in a different order. In an example for purposes of illustration, with respect to FIG. 7A, the scanning of sub-block 222A may be followed by sub-block 222C or sub-block 222D.

In addition, more than one of the sub-blocks 222 or 226 may be completely coded prior to the sub-blocks 222 or 226 themselves being scanned. That is, after coding the sub-blocks 222 and 226, the sub-blocks themselves may be scanned according to a particular scan order. In some examples, sub-blocks 222 or 226 may be diagonally scanned, although other scans such as zig-zag, horizontal, and vertical may also be used. The specific scan used for scanning within sub-blocks, as well as for scanning the sub-blocks themselves may depend on an intra-mode used to generate the residual data of the transform coefficients.

Figure 8:
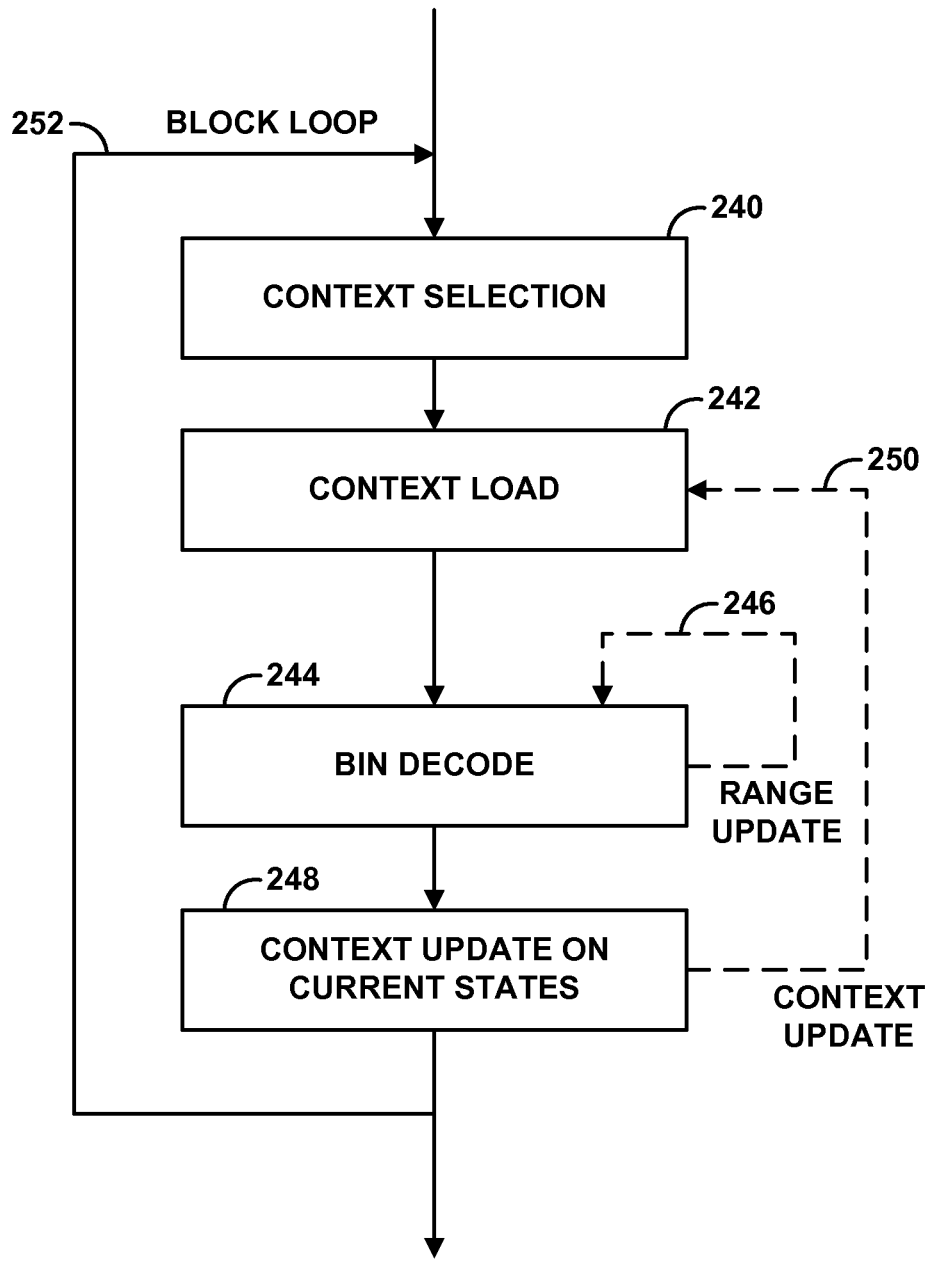
FIG. 8 is a flow diagram illustrating an example of coding a significance map using a context adaptive coding technique.

FIG. 8 generally illustrates coding a significance map using a context adaptive coding technique, such as CABAC. While FIG. 8 is generally described with respect to video decoder 30 (FIGS. 1 and 3), it should be understood that the techniques of this disclosure may be carried out by a variety of other video coders, including video encoder 20 (FIGS. 1 and 2), other processors, processing units, hardware-based coding units such as encoder/decoders (CODECs), and the like.

According to the example shown in FIG. 8, video decoder 30 initially selects context for decoding a particular bin of binarized transform coefficients (240). As noted above, context for a bin of a syntax element may include values of related bins of previously coded syntax elements. Context may relate to, for example, whether values are zero or non-zero for symbols neighboring a symbol currently being coded.

Video decoder 30 then loads the probability (e.g., the state of context) corresponding to the selected context ("context load" (242)). That is, video decoder 30 determines the state of context associated with a probability model. Video decoder 30 then decodes the current bin using the loaded probability ("bin code" (244)). According to the example shown in FIG. 8, video decoder 30 updates a range of the arithmetic coder in a serial manner, e.g., on a bin-by-bin basis. Accordingly, after coding a particular bin, video decoder 30 then updates the range of the arithmetic coder with the value of the particular bin ("range update" (246)).

The range update (246) shown in FIG. 8 introduces a serial dependency in the decoding process. That is, the following bins have a serial dependency on the operation "bin decode" (244). That is, the "bin decode" needs to be completed before decoding following bins. In addition, video decoder 30 updates the probability based on the decoded bin ("context update on current states" (248)). In the example shown in FIG. 8, video decoder 30 uses the updated context to decode the next bin ("context update" (250)). Accordingly, the following bins also have a serial dependency on the operation "context update on current states." That is, the "context update on current states" (248) step needs to be completed before decoding following bins. Video decoder 30 continues in this manner until all bins of a particular block have been coded. Video decoder 30 then moves on to the next block of video data ("block loop" (252)).

In an example for purposes of illustration, video decoder 30 may decode a sequence of bins (e.g., bin(0), bin(1), . . . bin(n)) of a block of video data in succession using a same probability model (e.g., probability model A). In other words, the contexts derived for the bins (e.g., indicated using context indices ctx(0), ctx(1), . . . ctx(n)) may each correspond to the same probability model used to code the respective bins. In this example, after decoding a given one of the bins, video decoder 30 must update the probability model (step 248) based on a value of a current bin before the probability model can be used to decode any subsequent bins. Updating the probability model allows the model to reflect the most current probabilities of a bin coded using the model having a given value. As such, decoding a particular bin for a block of video data using a probability model updated following completion of a previous decoding cycle, i.e., decoding of a previous bin, may create a delay between the successive coding cycles. Specifically, the probability model may not be readily available to code the particular bin immediately after decoding the previous bin. As a result, the coding of the sequence of bins may not be as streamlined as decoding the sequence using other methods.

Accordingly, the "range update" and "context update" steps include a feedback loop at both the encoder and decoder. Such feedback loops may present a computational bottleneck, as it may be difficult to increase throughput due to the dependencies in the feedback loops. That is, one bin may not be processed until the probability model from the previous bin has been updated. According to HEVC as currently proposed, the same context index may be called continuously (bin by bin) with high frequency. In an example, the context for significance flag coding, which may represent from 25% to 35% of the total bins coded, may be called continuously. Repeatedly calling the same context and waiting to update the model after each bin may present a bottleneck for the throughput of video decoder 30.

In some examples, to avoid such a bottleneck, video decoder 30 may store certain statistics (e.g., state of context) and update one or more contexts after coding an entire block of video data. In this way, the following block uses the probabilities as updated by the current block, and delay associated with updating context is only incurred once every block. The overall coding performance, however, may decline, because the probabilities are not updated bin by bin and may therefore be less accurate.

As noted above, while described with respect to decoding data with video decoder 30, techniques similar to or the same as those described in FIG. 8 may be performed with another video coder, such as video encoder 20.

Figure 9:
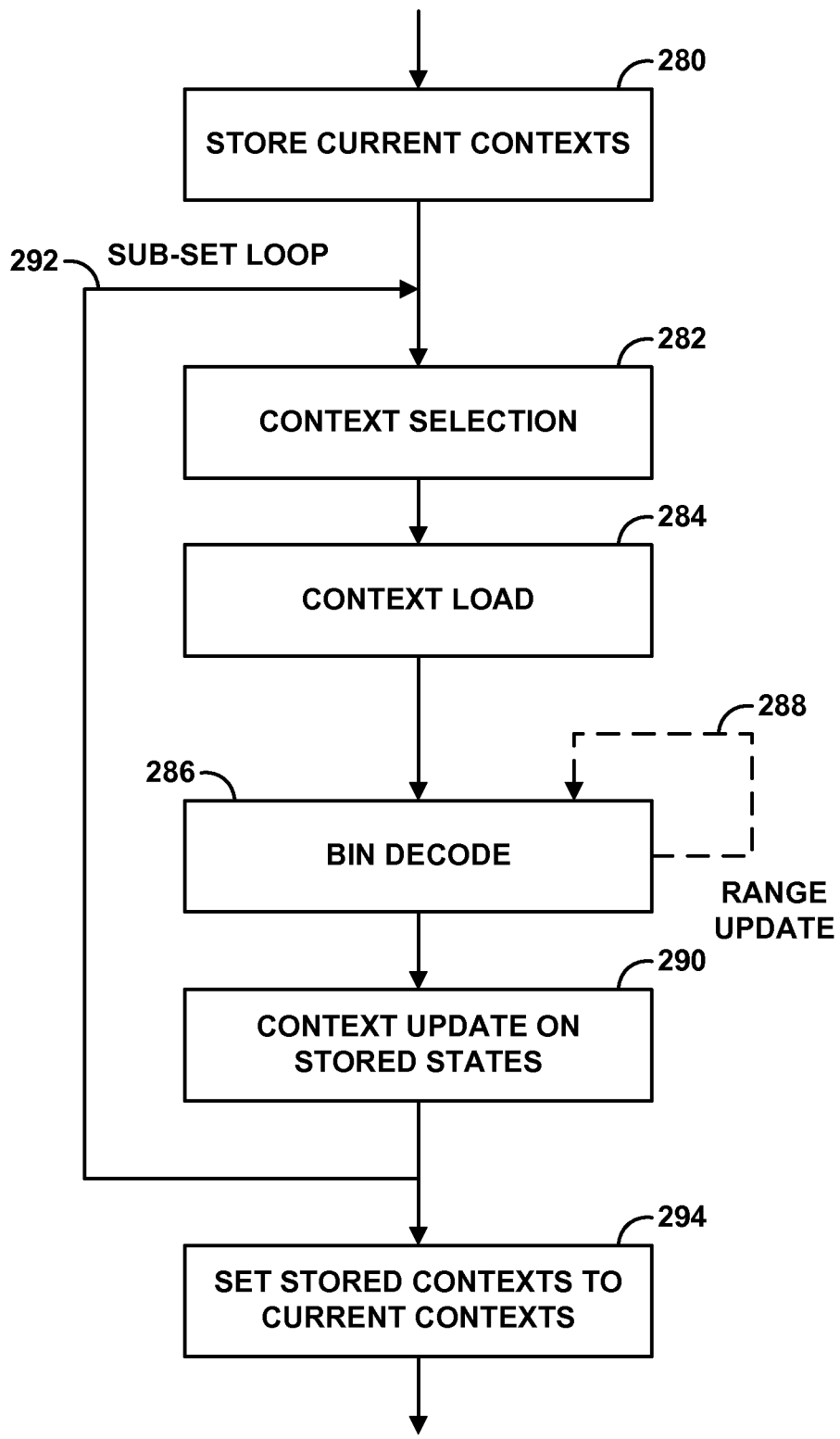
FIG. 9 is a flow diagram illustrating an example of a modified context adaptive coding process in which context may be updated after coding a sub-set.

FIG. 9 generally illustrates a modified context adaptive coding process in which context may be updated after coding a sub-set, according to aspects of this disclosure. While FIG. 9 is generally described with respect to video decoder 30 (FIGS. 1 and 3), it should be understood that the techniques of this disclosure may be carried out by a variety of other video coders, including video encoder 20 (FIGS. 1 and 2), other processors, processing units, hardware-based coding units such as encoder/decoders (CODECs), and the like.

In the example shown in FIG. 9, video decoder 30 first stores the current states of all the relevant contexts to memory (280). As an example, for transform coefficient coding only states of contexts used in transform coefficient coding would be stored. Video decoder 30 then selects context for decoding a particular bin of a binarized transform coefficient (282). Video decoder 30 then loads the probability (e.g., the state of context) corresponding to the selected context ("context load" (284)). Video decoder 30 then decodes the current bin using the loaded probability ("bin code" (286)). Video decoder 30 also updates the range of the arithmetic coder bin by bin ("range update" (288)).

According to aspects of this disclosure, rather than updating the context for coding the next bin (as shown, for example, in FIG. 8), video decoder 30 may store probability statistics for the probabilities associated with the context used during coding of the bin (290). That is, video decoder 30 may store an updated state of context based on the coded bin. Accordingly, the probability for coding the next bin is not changed, and there is no dependency on an updated probability within the block loop. Rather, video decoder 30 continues coding all bins of the sub-set ("sub-set loop" (292)).

Following decoding of a sub-set, according to aspects of this disclosure, video decoder 30 may set the stored contexts to the current contexts for coding the next sub-set (294). That is, video decoder 30 may update one or more probability models based on stored probability statistics collected during the decoding of the previous sub-set. Accordingly, video decoder 30 may decode the following sub-set using updated probabilities. Since the updating and storing operations are performed out of the sub-set loop, the operations do not cause a delay after each bin. Rather, delay associated with updating context is only incurred once every sub-set. In the example shown in FIG. 9, the memory needed for storing context state updates during decoding of a block may be equal to the context size of the bins being decoded. For example, if video decoder is decoding transform coefficients associated with a block of video data, contexts used during transform coefficient coding may need to be stored.

As noted above, while described with respect to decoding data with video decoder 30, techniques similar to or the same as those described in FIG. 9 may be performed with another video coder, such as video encoder 20.

Figure 10:
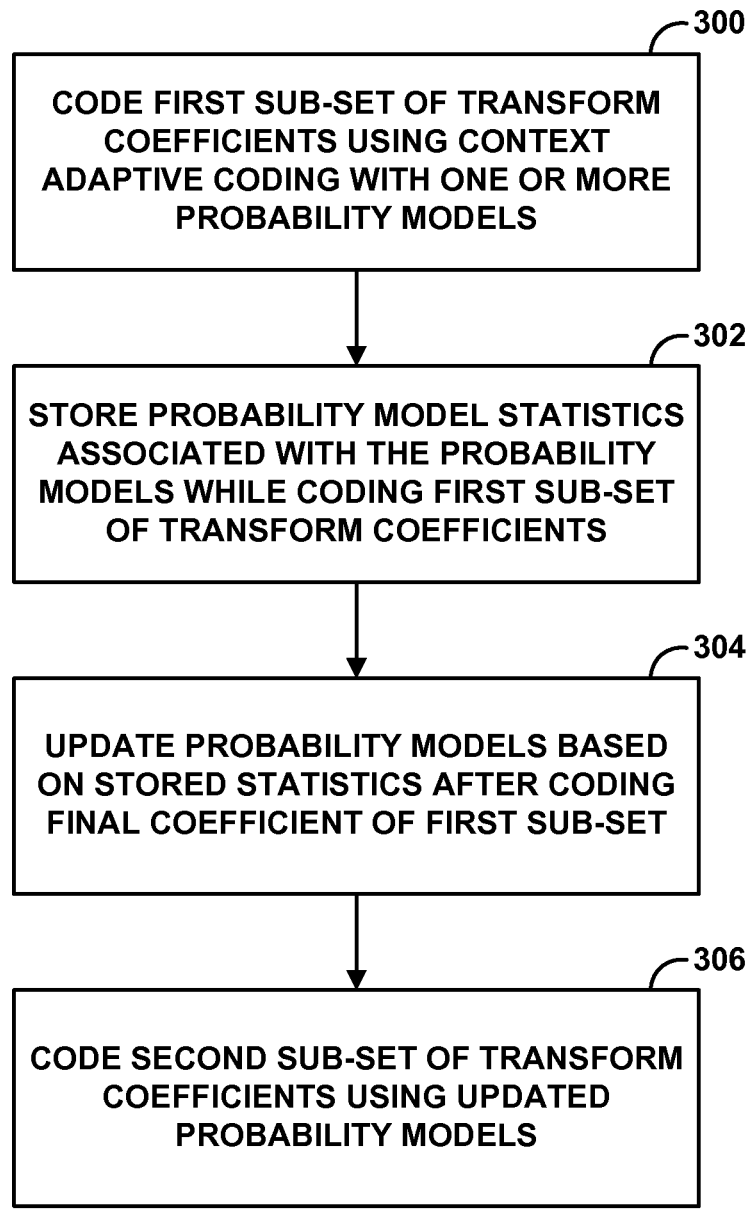
FIG. 10 is a flow diagram illustrating an example technique of entropy coding a block of video data.

FIG. 10 is a flow diagram illustrating an example technique of entropy coding a block of video data, according to aspects of this disclosure. The example shown in FIG. 10 is generally described as being performed by a video coder. That is, for example, in examples in which the video coder is a video encoder, the encoder may code a target symbol using a probability model. In examples in which the video coder is a video decoder, the decoder may parse a target symbol using a probability model. Accordingly, it should be understood that the techniques shown and described with respect to FIG. 10 may be carried out by video encoder 20 (FIGS. 1 and 2), video decoder 30 (FIGS. 1 and 3), or a variety of other processors, processing units, hardware-based coding units such as encoder/decoders (CODECs), and the like.

In the example shown in FIG. 10, a video coder codes a first sub-set of transform coefficients using context adaptive coding with one or more probability models (302). For example, the video coder may CABAC code the first sub-set of transform coefficients. As noted above, the first sub-set may include a predetermined number of transform coefficients in scanning order, or may include a sub-block of transform coefficients. Accordingly, a block of video data may generally include n/m sub-sets, where n represents the number of transform coefficients and m represents the number of transform coefficients in each subset.

While coding the first sub-set of transform coefficients, the video coder may store probability model statistics associated with the probability models used to code the first sub-set (302). For example, the video coder may store the state of the context after coding each bin of the first sub-set. The state of the context may indicate a particular probability based on the value of the bins being coded. The video coder may also store actual bin values for generating probabilities.

Then, after coding a final coefficient of the first sub-set, the video coder may update the probability models based on the stored probability model statistics (304). The video coder may then code a second sub-set of transform coefficients using the updated probability models (306). It should be understood that the techniques described with respect to FIG. 10 may be performed for a subset of bins of transform coefficients. That is, some bins of a sub-set may not be coded using context adaptive coding, but rather coded in a bypass mode, without updating probabilities.

The techniques described in FIG. 10 may strike a balance between increasing throughput and accurate probabilities. For example, the techniques described in FIG. 10 may enhance parallelization for each sub-set (e.g., allowing multiple bins to be coded in parallel), while also using more accurate probabilities for subsequently coded sub-sets.

It should also be understood that the steps shown and described with respect to FIG. 10 are provided as merely one example. That is, the steps of the method of FIG. 10 need not necessarily be performed in the order shown in FIG. 10, and fewer, additional, or alternative steps may be performed.

Figure 11:
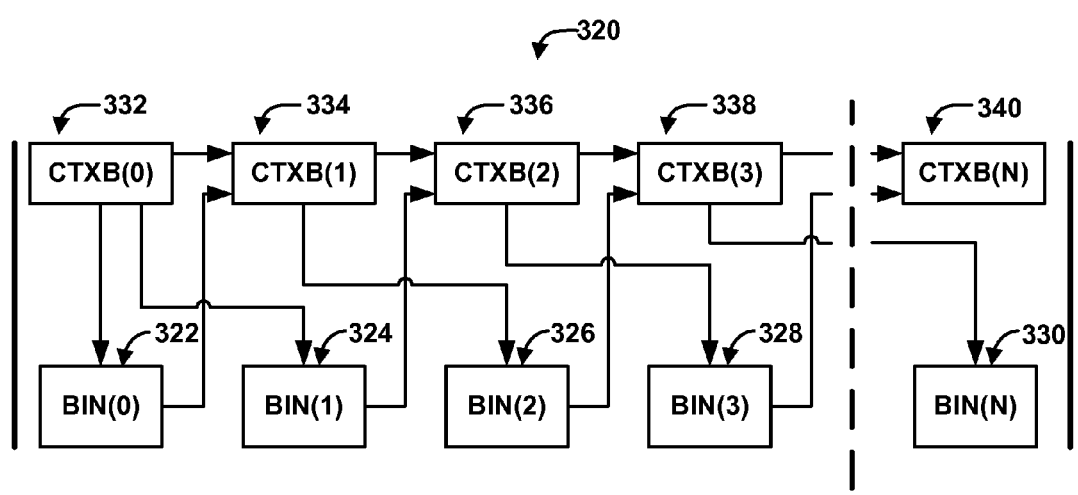
FIG. 11 is a conceptual diagram that illustrates an example of coding a sequence of bins using delayed state update context adaptive entropy coding.

FIG. 11 is a conceptual diagram that illustrates coding a sequence of bins 320 using delayed state update context adaptive entropy coding, according to aspects of this disclosure. While FIG. 11 is generally described with respect to video decoder 30 (FIGS. 1 and 3), it should be understood that the techniques of this disclosure may be carried out by a variety of other video coders, including video encoder 20 (FIGS. 1 and 2), other processors, processing units, hardware-based coding units such as encoder/decoders (CODECs), and the like.

As shown in FIG. 11, video decoder 30 may decode a sequence of bins 320 that includes bins BIN(0)-BIN(N) 322-330. The bins BIN(0)-BIN(N) 322-330 are each associated with a context index that corresponds to a probability model stored in context buffer CTXB(0)-CTXB(N) 332-340. Here the context buffer CTXB(K) stores the states corresponding to all the contexts after BIN(K−1) has been decoded and the context state corresponding to BIN(K−1) has been updated. In the example of FIG. 11, as part of an initializing a decoding cycle, video decoder 30 may decode BIN(0) 322 using an initial probability model (which may be referred to as an initial "revision") that is stored in a context buffer CTXB(0) 332.

According to aspects of this disclosure, video decoder 30 may decode the subsequent bins, BIN(1)-BIN(N) 324-330 using probability model revisions corresponding to at least two coding cycles prior to their respective coding cycles, which may be stored in context buffers CTXB(0)-CTXB(N−1). For example, video decoder 30 may decode each of BIN(1)-BIN(N) 324-330 using a probability model revision that occurred prior to a previous coding cycle relative to its current coding cycle.

In an example for purposes of illustration, video decoder 30 may decode BIN(1) 324 using an initial probability model revision stored in CTXB(0) 332. This initial probability model revision existed, or "occurred," prior to decoding BIN(0) 322. Likewise, video decoder 30 may code BIN(2) 326 using a probability model revision stored in CTXB(1), which existed prior to decoding BIN(1) 324.

While the example shown in FIG. 11 generally illustrates a two cycle state delay, the techniques of this disclosure are generally applicable to delayed state updates having additional delay cycles. For example, according to aspects of this disclosure, video decoder 30 may code BIN(2) 326 using a probability model revision stored in CTXB(0) (e.g., a three cycle delay). Additional delayed state cycles may also be implemented (e.g., a four cycle delay, a five cycle delay, and the like).

The number of delay cycles may, in some examples, correspond to the number of bins to be coded in parallel. For example, the example shown in FIG. 11 may generally allow two bins to be decoded in parallel without incurring the delay associated with updating probabilities between bins. That is, video decoder 30 may decode BIN(1) 324 and BIN(2) 326 in parallel without incurring delay associated with state update, because the bins use already determined probability model revisions. Additional cycles of delay may allow more bins to be decoded in parallel.

The techniques shown and described with respect to FIG. 11 may be used with any context adaptive entropy coding methodology, including CAVLC, CABAC, PIPE, or another context adaptive entropy coding methodology. Moreover, the techniques shown and described with respect to FIG. 11 may be generally applied to other arithmetic coding of other data (e.g., audio data or a variety of other data). For example, the techniques of FIG. 11 may be used to perform a delayed probability update.

As an example, for purposes of illustration, assume that a sequence of symbols, e.g., symbol(0), symbol(1), . . . , symbol(n), etc. are being encoded or decoded. The symbols may be generated by video data, audio data, or any other data. Furthermore, assume that each symbol may take four values denoted by A, B, C, and D. In addition, assume that a different context model may be associated with each symbol, but for purposes of illustration, all the symbols use the same context. In addition, assume that a separate probability model (e.g., probabilities for A, B, C, and D) is maintained for each context. Normally, after symbol(0) is coded, the probability model for context(0) would be updated to account for the actual value of symbol(0). However, as shown in FIG. 11, the techniques of this disclosure may include implementing a probability model update delay, such that the probability model update process is delayed until one or more future symbols are being coded. For example, for a delay of one, the updated model (e.g., after coding symbol(0)) is available for coding symbol(2). In this example, a buffer (similar to context buffer CTXB described above, may be used to store probability models.

Figure 12:
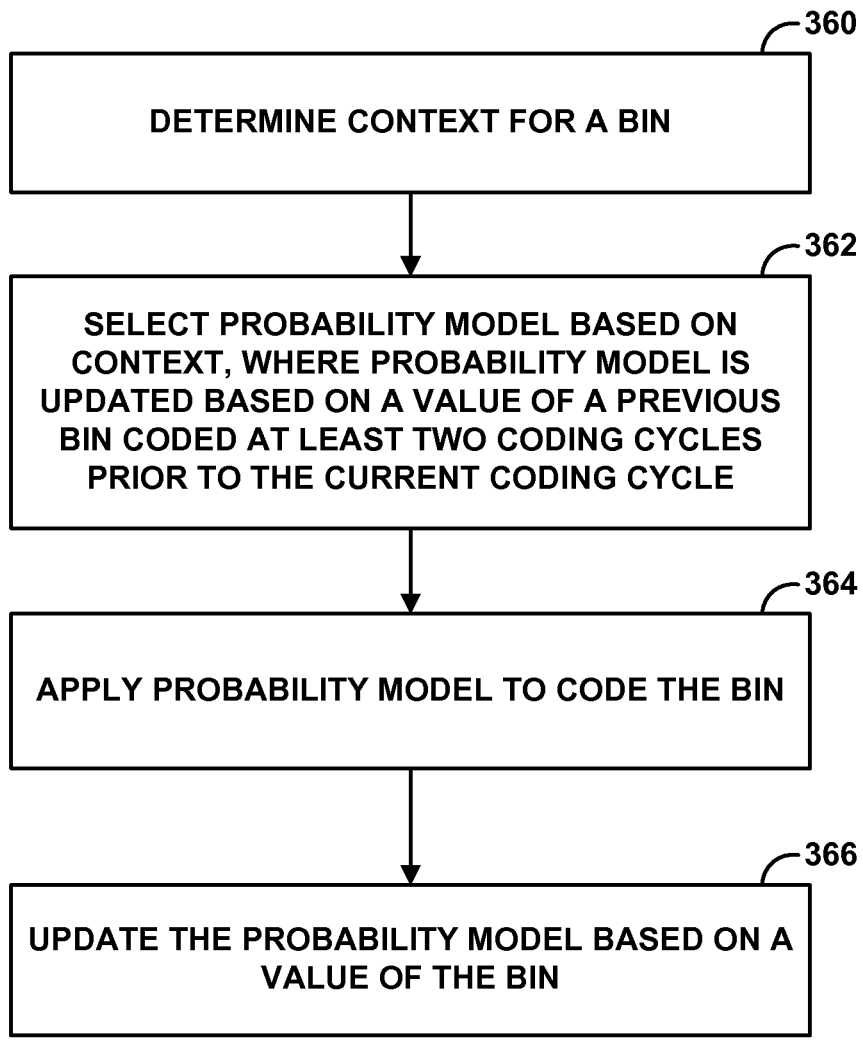
FIG. 12 illustrates and example technique of coding a sequence of bins using delayed state update context adaptive entropy coding.

FIG. 12 illustrates an example technique of coding a sequence of bins using delayed state update context adaptive entropy coding, according to aspects of this disclosure. The example shown in FIG. 12 is generally described as being performed by a video coder. That is, for example, in examples in which the video coder is a video encoder, the encoder may code a target symbol (e.g., bin) using a probability model. In examples in which the video coder is a video decoder, the decoder may decode a target symbol (e.g., bin) using a probability model. Accordingly, it should be understood that the techniques shown and described with respect to FIG. 10 may be carried out by video encoder 20 (FIGS. 1 and 2), video decoder 30 (FIGS. 1 and 3), or a variety of other processors, processing units, hardware-based coding units such as encoder/decoders (CODECs), and the like.

In the example shown in FIG. 12, a video coder initially determines context for a bin during an entropy coding cycle (360). As noted above, an entropy coding cycle generally includes determining context that corresponds to a probability model used to code the bin and applying the probability model to code the bin.

The video coder may then select a probability model based on context, where the probability model is updated based on a value of a previously coded bin that was coded at least two cycles prior to the current coding cycle (362). For example, in general, the context for the bin, e.g., bin(n), may be indicated using a context index, e.g., ctx(n), that corresponds to a probability model. However, according to the techniques of this disclosure, the video coder may code a particular bin of a block of video data using a probability model that is updated prior to coding a pervious bin of the block, i.e., at least two coding iterations, or cycles, prior to coding the current bin. Accordingly, as described in greater detail below, the video coder may avoid delays that result from updating a probability model after coding a bin using the model, when multiple consecutive bins are coded using the model.

In an example for purposes of illustration, assume that a sequence of bins, e.g., bin(0), bin(1), . . . , bin(n−1), and bin(n), of a block of video data is coded in succession by performing a CABAC process. Assume, in this example, that the contexts used for coding bin(0), bin(1), . . . , bin(n−1), and bin(n) be denoted by ctx(0), ctx(1), . . . , ctx(n−1), and ctx(n). In addition, assume that the probability models (or states) corresponding to all the contexts be stored in ctxBuffer(0), ctxBuffer(1), . . . , ctxBuffer(n−1), and ctxBuffer(n). Here the context buffer ctxBuffer(K) stores the states corresponding to all the contexts after bin(K−1) has been coded and the context state corresponding to bin(K−1) has been updated. The use of such a buffer may be needed to maintain multiple versions, or "revisions" of probability models used to code the bins. The probability model may be defined by an initial state, and, as previously described, may be influenced by previously coded bins, i.e. bin(0), bin(1), . . . , bin(n−1). According to the emerging HEVC and H.264 standards, the following steps are performed to code bin(n):

1. Determine a context ctx(n) that will be used to code bin(n).
2. Retrieve a probability model for ctx(n) from a context buffer ctxBuffer(n).
3. Encode bin(n) using the probability model.
4. Update the probability model based on bin(n). The updated probability model is included in ctxBuffer(n+1).

As illustrated by the process shown above, the CABAC process cannot proceed to code a next bin, e.g., bin(n+1), until all of the steps are completed, which may create a delay in the coding process. According to aspects of this disclosure, the video coder may code bin(n) using a probability model included in ctxBuffer(n−K). That is, for example, aspects of this disclosure include modifying Step 2 of the process shown above so that the video coder retrieves a probability model for ctx(n) from a context buffer ctxBuffer(n−K). In examples in which "n" is less than or equal to "K", the video coder may use ctxBuffer(0).

The index "K" may equal any positive non-zero integer value. For example, for "K" values of "1," the context buffer ctxBuffer(n−1) includes a probability model updated two coding cycles prior to the current coding cycle. In particular, the probability model included in ctxBuffer(n−1) may correspond to the probability model included in ctxBuffer(n−2) that is updated following coding bin(n−2).

According to aspects of this disclosure, the video coder may use an initial probability model to code the first and second bins of the sequence. For example, the video coder may code both bin(0) and bin(1) of a given sequence using ctxBuffer(0). Bin(0) may be coded in this manner because no previously updated probability models exist. Bin(1) may be coded in this manner to avoid a state update delay that may result from updating the probability model included in ctxBuffer(0) based on the value of bin(0) to be included in ctxBuffer(1). Accordingly, in some examples, step 362 may be performed after coding a predetermined number of bins.

After selecting a probability model (362), the video coder may apply the probability model to code the bin (364). The video coder may then update the probability model based on a value of the bin (366). By avoiding delays associated with state updates in context adaptive coding, the aspects shown and described with respect to FIG. 12 may enable efficient coding of residual transform coefficients of blocks of video data when performing a CABAC process in video coding. Additionally, in examples where context partitioning is used, the techniques of this disclosure can be applied for each context partition.

As noted above with respect to FIG. 11, while described above with respect to binary video coding, it should be understood that the delayed state update techniques may be generally applied to other arithmetic coding of other data. In addition, it should also be understood that the steps shown and described with respect to FIG. 12 are provided as merely one example. That is, the steps of the method of FIG. 12 need not necessarily be performed in the order shown in FIG. 12, and fewer, additional, or alternative steps may be performed.

It should be understood that, depending on the example, certain acts or events of any of the methods described herein can be performed in a different sequence, may be added, merged, or left out all together (e.g., not all described acts or events are necessary for the practice of the method). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol.

In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium.

It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various aspects of the disclosure have been described. These and other aspects are within the scope of the following claims.

What is claimed is:

1. A method of coding video data, the method comprising:
  coding a sequence of bins of a block of the video data according to a context adaptive entropy coding process having a plurality of coding cycles, wherein each coding cycle codes one bin of the sequence of bins and, wherein a current coding cycle includes:
    determining a context for the bin;
    selecting a first probability model based on the context, wherein the first probability model has been updated based on a value of a previous bin of the block coded with the context and coded at least two coding cycles prior to the current coding cycle;
    applying the first probability model to code the bin; and
    updating a second probability model based on a value of the bin.

2. The method of claim 1, wherein the first probability model is stored to a context buffer, wherein the at least two coding cycles comprise a delay of K cycles, and wherein selecting the first probability model comprises selecting the first probability model stored in the context buffer at least (K+1) cycles prior to the current coding cycle.

3. The method of claim 1, wherein two or more consecutive bins of the sequence of bins are each coded using their respective coding cycles, and wherein the respective contexts determined for each of the two or more bins comprise a same context.

4. The method of claim 1, wherein the bin of the sequence of bins comprises any bin of the sequence other than an initial bin of the sequence and a bin following the initial bin in a coding order, the method further comprising an initializing the coding cycle used to code each of the initial bin and the bin following the initial bin, including:
  determining an initializing context for the respective bin;
  selecting an initializing probability model based on the initializing context;
  applying the initializing probability model based on the initializing context to code the respective bin; and
  updating the initializing probability model based on a value of the respective bin.

5. The method of claim 1, wherein the sequence of bins includes significance bins and level bins, and wherein coding the sequence of bins according to the context adaptive entropy coding process comprises context adaptive coding the significance bins and bypass coding the level bins.

6. The method of claim 1, wherein the sequence of bins comprises a first sequence of bins of a first partition and a second sequence of bins of a second partition, and wherein the method further comprises coding the second sequence of bins of the second partition using the context adaptive entropy coding process in parallel with coding the first sequence of bins of the first partition.

7. The method of claim 1, further comprising coding at least two bins of the sequence of bins corresponding to the at least two coding cycles prior to the current coding cycle in parallel.

8. The method of claim 1, wherein the context adaptive entropy coding process comprises a context adaptive binary arithmetic coding (CABAC) process.

9. The method of claim 1, wherein coding the sequence of bins comprises encoding the sequence of bins.

10. The method of claim 9, further comprising, prior to encoding the sequence of bins:
  applying a transform to one or more residual values of a block of video data to generate transform coefficients;
  quantizing the transform coefficients to generate quantized transform coefficients; and
  binarizing the quantized transform coefficients to generate the sequence of bins.

11. The method of claim 1, wherein coding the sequence of bins comprises decoding the sequence of bins.

12. The method of claim 11, further comprising: determining quantized transform coefficients based on the sequence of bins; inverse quantizing the quantized transform coefficients to generate transform coefficients; and applying an inverse transform to the inverse quantized sequence of bins to generate residual values of a block of video data.

13. An apparatus for coding video data, the apparatus comprising:
  a memory configured to store a sequence of bins of video data; and
  one or more processors configured to:
    code the sequence of bins of a block of the video data according to a context adaptive entropy coding process having a plurality of coding cycles, wherein each coding cycle codes one bin of the sequence of bins, wherein the one or more processors are configured to, for a current coding cycle:
    determine a context for the bin;
    select a first probability model based on the context, wherein the first probability model has been updated based on a value of a previous bin of the block coded with the context and coded at least two coding cycles prior to the current coding cycle;
    apply the first probability model to code the bin; and
    update a second probability model based on a value of the bin.

14. The apparatus of claim 13, wherein the memory comprises a context buffer storing the first probability model, wherein the at least two coding cycles comprise a delay of K cycles, and wherein to select the first probability model, the one or more processors are configured to select the first probability model stored in the context buffer at least (K+1) cycles prior to the current coding cycle.

15. The apparatus of claim 13, wherein two or more consecutive bins of the sequence of bins are each coded using their respective coding cycles, and wherein the respective contexts determined for each of the two or more bins comprise a same context.

16. The apparatus of claim 13, wherein the bin of the sequence of bins comprises any bin of the sequence other than an initial bin of the sequence and a bin following the initial bin in a coding order, wherein the one or more processors are further configured to use an initializing coding cycle to code each of the initial bin and the bin following the initial bin, including:
- determine an initializing context for the respective bin;
- select an initializing probability model based on the initializing context;
- apply the initializing probability model based on the initializing context to code the respective bin; and
- update the initializing probability model based on a value of the respective bin.

17. The apparatus of claim 13, wherein the sequence of bins includes significance bins and level bins, and wherein to code the sequence of bins according to the context adaptive entropy coding process, the one or more processors are configured to context adaptive code the significance bins and bypass code the level bins.

18. The apparatus of claim 13, wherein the sequence of bins comprises a first sequence of bins of a first partition and a second sequence of bins of a second partition, and wherein the one or more processors are further configured to code the second sequence of bins of the second partition using the context adaptive entropy coding process in parallel with coding the first sequence of bins of the first partition.

19. The apparatus of claim 13, wherein the one or more processors are further configured to code at least two bins of the sequence of bins corresponding to the at least two coding cycles prior to the current coding cycle in parallel.

20. The apparatus of claim 13, wherein the context adaptive entropy coding process comprises a context adaptive binary arithmetic coding (CABAC) process.

21. The apparatus of claim 13, wherein to code the sequence of bins, the one or more processors are configured to encode the sequence of bins.

22. The apparatus of claim 21, wherein the one or more processors are further configured to, prior to encoding the sequence of bins:
- apply a transform to one or more residual values of a block of video data to generate transform coefficients;
- quantize the transform coefficients to generate quantized transform coefficients; and
- binarize the quantized transform coefficients to generate the sequence of bins.

23. The apparatus of claim 13, wherein to code the sequence of bins, the one or more processors are configured to decode the sequence of bins.

24. The apparatus of claim 23, wherein the one or more processors are further configured to:
- determine quantized transform coefficients based on the sequence of bins;
- inverse quantize the quantized transform coefficients to generate transform coefficients; and
- apply an inverse transform to the inverse quantized sequence of bins to generate residual values of a block of video data.

25. An apparatus for coding data, the apparatus comprising:
- means for coding a sequence of bins of a block of video data according to a context adaptive entropy coding process having a plurality of coding cycles, wherein each coding cycle codes one bin of the sequence of bins, and wherein the means for coding the sequence of bins comprises:
  - means for determining, for a current coding cycle, a context for the bin;
  - means for selecting, for the current coding cycle, a first probability model based on the context, wherein the first probability model has been updated based on a value of a previous bin of the block coded with the context and coded at least two coding cycles prior to the current coding cycle;
  - means for applying, for the current coding cycle, the first probability model to code the bin; and
  - means for updating, for the current coding cycle, a second probability model based on a value of the bin.

26. The apparatus of claim 25, wherein the apparatus further comprises means for storing the first probability model, wherein the at least two coding cycles comprise a delay of K cycles, and wherein the means for selecting the first probability model comprises means for selecting the first probability model stored in the means for storing the probability model at least (K+1) cycles prior to the current coding cycle.

27. The apparatus of claim 25, wherein two or more consecutive bins of the sequence of bins are each coded using their respective coding cycles, and wherein the respective contexts determined for each of the two or more bins comprise a same context.

28. The apparatus of claim 25, wherein the bin of the sequence of bins comprises any bin of the sequence other than an initial bin of the sequence and a bin following the initial bin in a coding order, further comprising means for initializing a coding cycle used to code each of the initial bin and the bin following the initial bin, including:
- means for determining an initializing context for the respective bin;
- means for selecting an initializing probability model based on the initializing context;
- means for applying the initializing probability model based on the initializing context to code the respective bin; and
- means for updating the initializing probability model based on a value of the respective bin.

29. The apparatus of claim 25, wherein the sequence of bins comprises a first sequence of bins of a first partition and a second sequence of bins of a second partition, and wherein the means for coding is further configured to code the second sequence of bins of the second partition using the context adaptive entropy coding process in parallel with coding the first sequence of bins of the first partition.

30. The apparatus of claim 25, wherein the means for coding is further configured to code at least two bins of the sequence of bins corresponding to the at least two coding cycles prior to the current coding cycle in parallel.

31. The apparatus of claim 25, wherein the context adaptive entropy coding process comprises a context adaptive binary arithmetic coding (CABAC) process.

32. A non-transitory computer-readable storage medium having instructions stored thereon that, when executed, cause one or more processors to:
- code a sequence of bins of a block of video data according to a context adaptive entropy coding process having a plurality of coding cycles, wherein each coding cycle codes one bin of the sequence of bins, and wherein to code a current coding cycle, the instructions cause the one or more processors to:
  - determine a context for the bin;
  - select a first probability model based on the context, wherein the first probability model has been updated based on a value of a previous bin of the block coded with the context and coded at least two coding cycles prior to the current coding cycle;

apply the first probability model to code the bin; and
update a second probability model based on a value of the bin.

33. The non-transitory computer-readable storage medium of claim 32, wherein the instructions further cause the one or more processors to store the first probability model to a context buffer, wherein the at least two coding cycles comprise a delay of K cycles, and wherein to select the first probability model, the instructions cause the one or more processors to select the first probability model stored in the context buffer at least (K+1) cycles prior to the current coding cycle.

34. The non-transitory computer-readable storage medium of claim 32, wherein two or more consecutive bins of the sequence of bins are each coded using their respective coding cycles, and wherein the respective contexts determined for each of the two or more bins comprise a same context.

35. The non-transitory computer-readable storage medium of claim 32, wherein the bin of the sequence of bins comprises any bin of the sequence other than an initial bin of the sequence, and a bin following the initial bin in a coding order, wherein the instructions further cause the one or more processors to initialize a coding cycle used to code each of the initial bin and the bin following the initial bin, including:
determine an initializing context for the respective bin;
select an initializing probability model based on the initializing context;
apply the initializing probability model based on the initializing context to code the respective bin; and
update the initializing probability model based on a value of the respective bin.

36. The non-transitory computer-readable storage medium of claim 32, wherein the sequence of bins includes significance bins and level bins, and wherein to code the sequence of bins according to the context adaptive entropy coding process, the instructions cause the one or more processors to context adaptive code significance bins and bypass code the level bins.

37. The non-transitory computer-readable storage medium of claim 32, wherein the sequence of bins comprises a first sequence of bins of a first partition and a second sequence of bins of a second partition, and wherein the instructions cause the one or more processors to code the second sequence of bins of the second partition using the context adaptive entropy coding process in parallel with coding the first sequence of bins of the first partition.

38. The non-transitory computer-readable storage medium of claim 32, wherein the instructions cause the one or more processors to code at least two bins of the sequence of bins corresponding to the at least two coding cycles prior to the current coding cycle in parallel.

39. The non-transitory computer-readable storage medium of claim 32, wherein the context adaptive entropy coding process comprises a context adaptive binary arithmetic coding (CABAC) process.

40. A method of coding transform coefficients associated with residual video data in a video coding process, the method comprising:
coding a first sub-set of a plurality of subsets of transform coefficients, wherein coding the first sub-set comprises context-adaptive coding the first sub-set using one or more probability models, and wherein context-adaptive coding the first sub-set using the one or more probability models comprises context-adaptive coding the first sub-set without updating the one or more probability models;
storing, while coding the first sub-set of transform coefficients, probability model statistics associated with the one or more probability models;
updating, after coding a final coefficient of the first sub-set, the probability models based on the stored probability model statistics; and
coding a second sub-set of the transform coefficients using the updated one or more probability models.

41. The method of claim 40, further comprising:
storing, while coding the second sub-set of transform coefficients, second probability model statistics associated with the one or more probability models;
updating, after coding a final coefficient of the second sub-set, the probability models based on the stored second probability model statistics; and
coding a third sub-set of the plurality of sub-sets using the updated probability models from the second sub-set.

42. The method of claim 40, wherein coding the first sub-set comprises coding a significance map associated with the transform coefficients of the first sub-set.

43. The method of claim 40, wherein the sub-sets comprise sub-blocks of transform coefficients, the method further comprising consecutively coding each sub-set of the plurality of sub-sets.

44. The method of claim 40, wherein the sub-sets comprise sub-sets scanned sequentially based on a scan order of the transform coefficients, the method further comprising consecutively coding each sub-set of the plurality of sub-sets.

45. The method of claim 40, wherein:
coding, in a first scan, the first sub-set comprises coding a significance map associated with the transform coefficients of the first sub-set in a first scan, and coding, in one or more additional scans, a plurality of bins representing level information associated with the transform coefficients of the first sub-set;
storing probability model statistics comprises storing the probability model statistics during each scan; and
updating the probability models comprises updating the probability models after each scan.

46. The method of claim 40, further comprising coding the first sub-set in parallel with at least one other sub-set of the plurality of sub-sets.

47. The method of claim 40, wherein coding the transform coefficients comprises encoding the transform coefficients.

48. The method of claim 40, wherein coding the transform coefficients comprises decoding the transform coefficients.

49. An apparatus for coding transform coefficients associated with residual video data, the apparatus comprising:
a memory configured to store a plurality of subsets of transform coefficients; and
one or more processors configured to:
code a first sub-set of the plurality of subsets of transform coefficients, wherein coding the first sub-set comprises context-adaptive coding the first sub-set using one or more probability models, and wherein to context-adaptive code the first sub-set using the one or more probability models, the one or more processors are configured to context-adaptive code the first sub-set without updating the one or more probability models;
store, while coding the first sub-set of transform coefficients, probability model statistics associated with the one or more probability models;
update, after coding a final coefficient of the first sub-set, the probability models based on the stored probability model statistics; and
code a second sub-set of the transform coefficients using the updated one or more probability models.

50. The apparatus of claim 49, wherein the one or more processors are further configured to:

store, while coding the second sub-set of transform coefficients, second probability model statistics associated with the one or more probability models;
update, after coding a final coefficient of the second sub-set, the probability models based on the stored second probability model statistics; and
code a third sub-set of the plurality of sub-sets using the updated probability models from the second sub-set.

51. The apparatus of claim 49, wherein, to code the first sub-set, the one or more processors are configured to code a significance map associated with the transform coefficients of the first sub-set.

52. The apparatus of claim 49, wherein the sub-sets comprise sub-blocks of transform coefficients, wherein the one or more processors are configured to consecutively code each sub-set of the plurality of sub-sets.

53. The apparatus of claim 49, wherein the sub-sets comprise sub-sets scanned sequentially based on a scan order of the transform coefficients, wherein the one or more processors are configured to consecutively code each sub-set of the plurality of sub-sets.

54. The apparatus of claim 49, wherein the one or more processors are configured to:
code, in a first scan, the first sub-set comprising coding a significance map associated with the transform coefficients of the first sub-set in a first scan, and coding, in one or more additional scans, a plurality of bins representing level information associated with the transform coefficients of the first sub-set;
store probability model statistics comprising storing the probability model statistics during each scan; and
update the probability models comprising updating the probability models after each scan.

55. The apparatus of claim 49, wherein the one or more processors are configured to code the first sub-set in parallel with at least one other sub-set of the plurality of sub-sets.

56. The apparatus of claim 49, wherein the one or more processors comprise a video encoder.

57. The apparatus of claim 49, wherein the one or more processors comprise a video decoder.

58. A method of coding data, the method comprising:
coding a first sub-set of a plurality of subsets of transform coefficients, wherein coding the first sub-set comprises context-adaptive coding the first sub-set using one or more probability models, and wherein context-adaptive coding the first sub-set using the one or more probability models comprises context-adaptive coding the first sub-set without updating the one or more probability models;
storing, while coding the first sub-set of transform coefficients, probability model statistics associated with the one or more probability models;
updating, after coding a final coefficient of the first sub-set, the probability models based on the stored probability model statistics;
coding a second sub-set of the transform coefficients using the updated one or more probability models; and
coding a third sub-set of the transform coefficients including a sequence of bins of a block of video data, wherein coding the third subset comprises coding the sequence of bins according to a context adaptive entropy coding process having a plurality of coding cycles, wherein each coding cycle codes one bin of the sequence of bins, wherein a current coding cycle includes:
determining a context for the bin;
selecting a first probability model based on the context, wherein the first probability model has been updated based on a value of a previous bin of the block coded with the context and coded at least two coding cycles prior to the current coding cycle;
applying the first probability model to code the bin; and
updating a second probability model based on a value of the bin.

* * * * *